(12) United States Patent
Liu

(10) Patent No.: US 9,502,499 B2
(45) Date of Patent: Nov. 22, 2016

(54) SEMICONDUCTOR DEVICE STRUCTURE HAVING MULTI-LAYERED ISOLATION TRENCH STRUCTURES

(71) Applicant: TAIWAN SEMICONDUCTOR MANUFACTURING CO., LTD., Hsin-Chu (TW)

(72) Inventor: Ji-Feng Liu, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/621,829

(22) Filed: Feb. 13, 2015

(65) Prior Publication Data

US 2016/0240609 A1 Aug. 18, 2016

(51) Int. Cl.
*H01L 29/06* (2006.01)
*H01L 29/78* (2006.01)
*H01L 21/762* (2006.01)

(52) U.S. Cl.
CPC ..... *H01L 29/0649* (2013.01); *H01L 21/76224* (2013.01); *H01L 29/785* (2013.01)

(58) Field of Classification Search
CPC .......... H01L 29/0649; H01L 29/785
See application file for complete search history.

(56) References Cited

U.S. PATENT DOCUMENTS

| | | | | |
|---|---|---|---|---|
| 7,262,141 B2* | 8/2007 | Ko | | H01L 21/0206 257/E21.219 |
| 7,414,278 B2* | 8/2008 | Sugatani | | H01L 21/76229 257/296 |
| 7,429,520 B2* | 9/2008 | Song | | H01L 21/76224 257/E21.546 |
| 7,888,208 B2* | 2/2011 | Sheen | | H01L 21/76232 438/259 |
| 8,101,450 B1* | 1/2012 | Doan | | H01L 27/1463 438/218 |
| 8,148,784 B2* | 4/2012 | Lee | | H01L 21/76229 257/374 |
| 8,679,925 B2 | 3/2014 | Wang | | |
| 8,735,252 B2 | 5/2014 | Yu et al. | | |
| 2006/0202301 A1* | 9/2006 | Ohta | | H01L 21/76224 257/510 |
| 2006/0226455 A1* | 10/2006 | Lee | | H01L 21/823425 257/288 |
| 2007/0120183 A1* | 5/2007 | Lee | | H01L 21/76224 257/330 |
| 2008/0171414 A1* | 7/2008 | Kim | | H01L 21/823835 438/221 |
| 2008/0254593 A1* | 10/2008 | Eun | | H01L 21/76224 438/425 |
| 2009/0111255 A1* | 4/2009 | Eun | | H01L 29/66545 438/589 |
| 2009/0170280 A1* | 7/2009 | Park | | H01L 21/76232 438/425 |
| 2009/0176342 A1* | 7/2009 | Lee | | H01L 21/26586 438/270 |
| 2009/0203189 A1* | 8/2009 | Shin | | H01L 21/76229 438/435 |
| 2010/0090290 A1* | 4/2010 | Sheen | | H01L 29/66795 257/401 |
| 2011/0266627 A1* | 11/2011 | Lee | | H01L 21/823878 257/369 |
| 2013/0221491 A1 | 8/2013 | Wann et al. | | |
| 2014/0024186 A1* | 1/2014 | Yoo | | H01L 21/28211 438/275 |
| 2014/0231919 A1* | 8/2014 | Peng | | H01L 21/76224 257/368 |

\* cited by examiner

*Primary Examiner* — Ida M Soward
(74) *Attorney, Agent, or Firm* — Birch, Stewart, Kolasch & Birch, LLP

(57) ABSTRACT

A semiconductor device structure is provided. The semiconductor device structure includes a substrate having a first trench between a first active region and a second active region of the substrate. The semiconductor device structure includes an isolation structure in the first trench. The isolation structure includes a liner layer, an insulating layer, and an isolation layer. The liner layer covers an inner wall and a bottom surface of the first trench. The insulating layer covers the liner layer and has a second trench in the first trench. The isolation layer is over the insulating layer and fills the second trench. A first thickness of the insulating layer is greater than a second thickness of the liner layer.

20 Claims, 39 Drawing Sheets

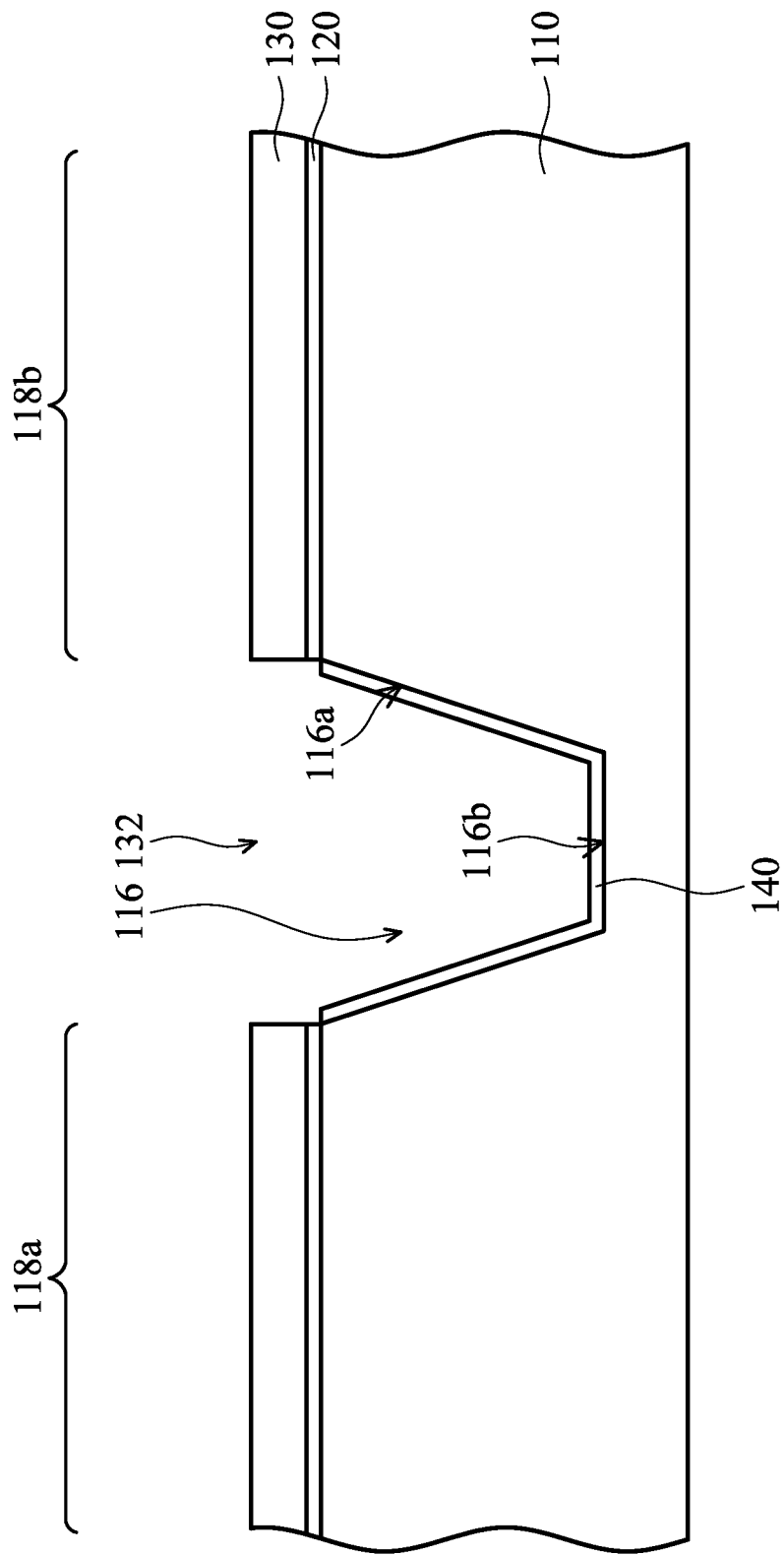

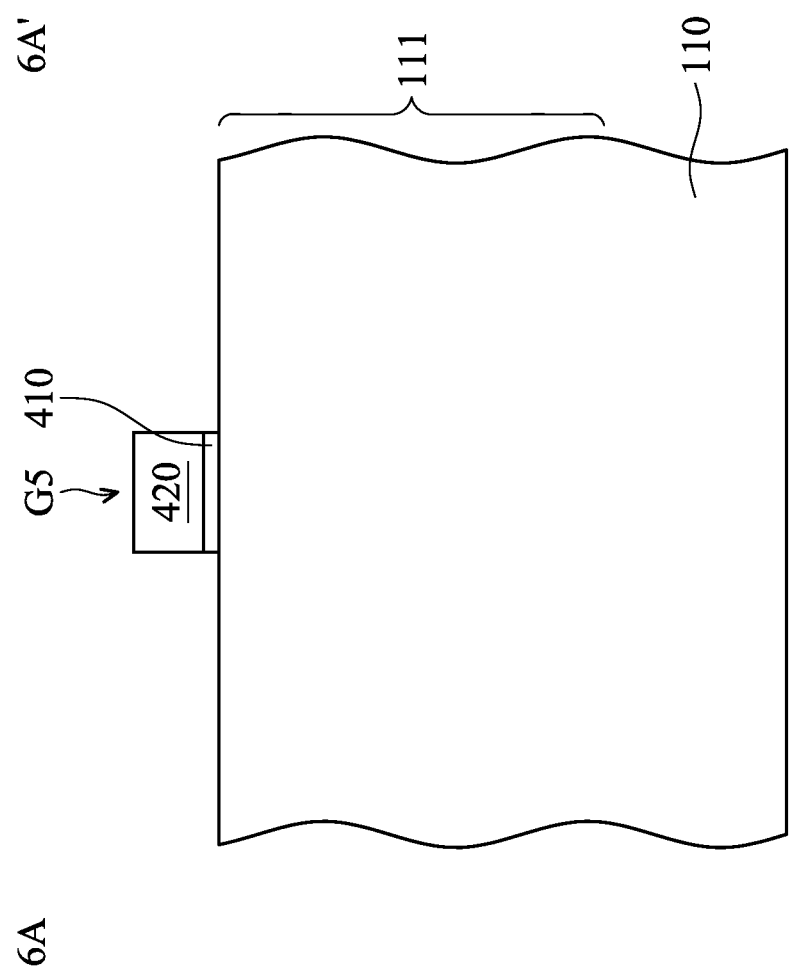

SEMICONDUCTOR DEVICE STRUCTURE HAVING MULTI-LAYERED ISOLATION TRENCH STRUCTURES

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1M are cross-sectional views of various stages of a process for forming a semiconductor device structure, in accordance with some embodiments.

FIGS. 6A-6G are cross-sectional views of various stages of a process for forming a semiconductor device structure, in accordance with some embodiments.

DETAILED DESCRIPTION

Figure 1A:
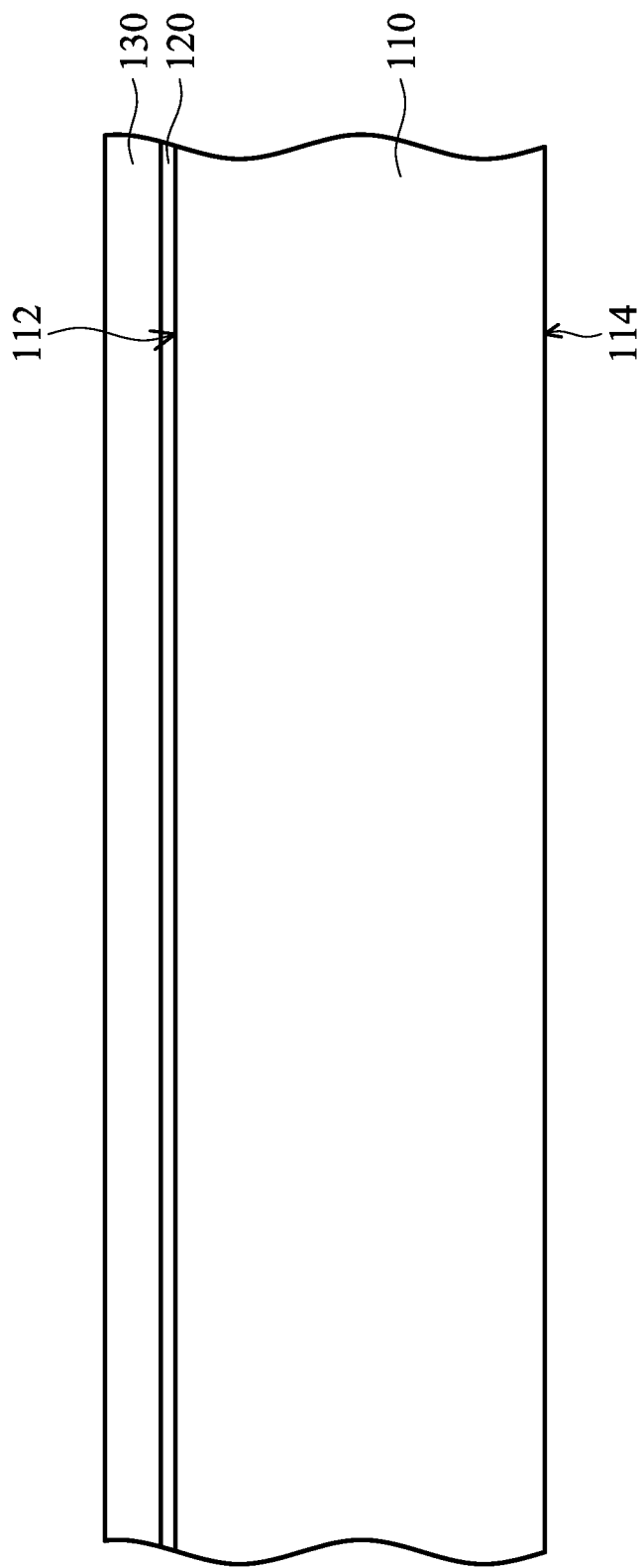

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1M are cross-sectional views of various stages of a process for forming a semiconductor device structure, in accordance with some embodiments. As shown in FIG. 1A, a substrate 110 is provided, in accordance with some embodiments. The substrate 110 has an upper surface 112 and a bottom surface 114, in accordance with some embodiments. The substrate 110 includes, for example, a semiconductor substrate. The semiconductor substrate includes, for example, a semiconductor wafer (such as a silicon wafer) or a portion of a semiconductor wafer.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

As shown in FIG. 1A, a mask layer 120 is deposited over the upper surface 112 of the substrate 110, in accordance with some embodiments. The mask layer 120 includes oxide (such as silicon oxide), in accordance with some embodiments. The mask layer 120 is deposited using a chemical vapor deposition process or a physical vapor deposition process, in accordance with some embodiments.

As shown in FIG. 1A, a mask layer 130 is deposited over the mask layer 120, in accordance with some embodiments. The mask layers 120 and 130 are made of different materials, in accordance with some embodiments. The mask layer 130 is thicker than the mask layer 120, in accordance with some embodiments. The mask layer 130 includes nitride (such as silicon nitride), in accordance with some embodiments. The mask layer 130 is deposited using a chemical vapor deposition process or a physical vapor deposition process, in accordance with some embodiments.

Figure 1B:
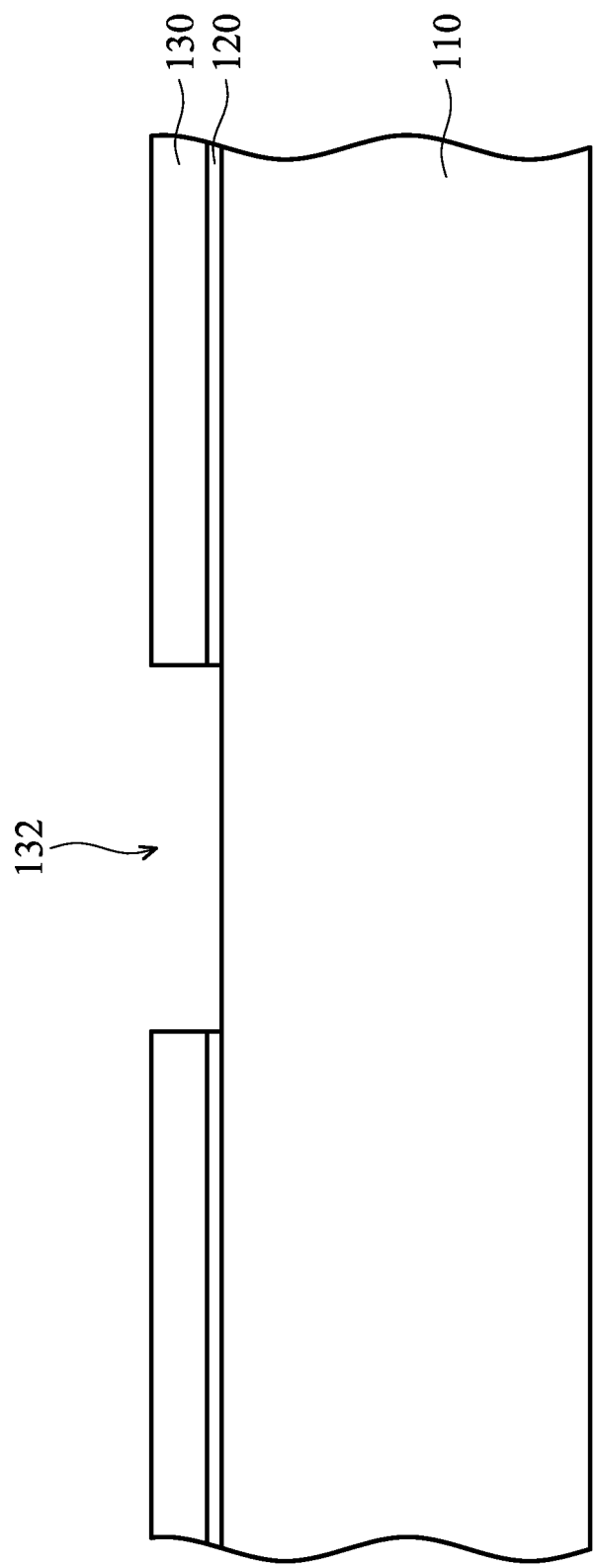

As shown in FIG. 1B, an opening 132 passing through the mask layers 120 and 130 is formed, in accordance with some embodiments. The opening 132 exposes a portion of the substrate 110, in accordance with some embodiments. The opening 132 is formed using a photolithography process and an etching process, in accordance with some embodiments.

As shown in FIG. 1C, the portion of the substrate 110 exposed by the opening 132 is removed through the opening 132 to form a trench 116 in the substrate 110, in accordance with some embodiments. The trench 116 is located between active regions 118a and 118b of the substrate 110, in accordance with some embodiments. The trench 116 separates the active region 118a from the active region 118b, in accordance with some embodiments. The removal process includes a dry etching process or another suitable etching process.

As shown in FIG. 1C, a liner layer 140 is formed over inner walls 116a and a bottom surface 116b of the trench 116, in accordance with some embodiments. The liner layer 140 conformally covers the inner walls 116a and the bottom surface 116b, in accordance with some embodiments. The liner layer 140 includes oxide (such as silicon oxide), in accordance with some embodiments. The liner layer 140 is formed by a thermal oxidation process, in accordance with some embodiments.

Figure 1D:
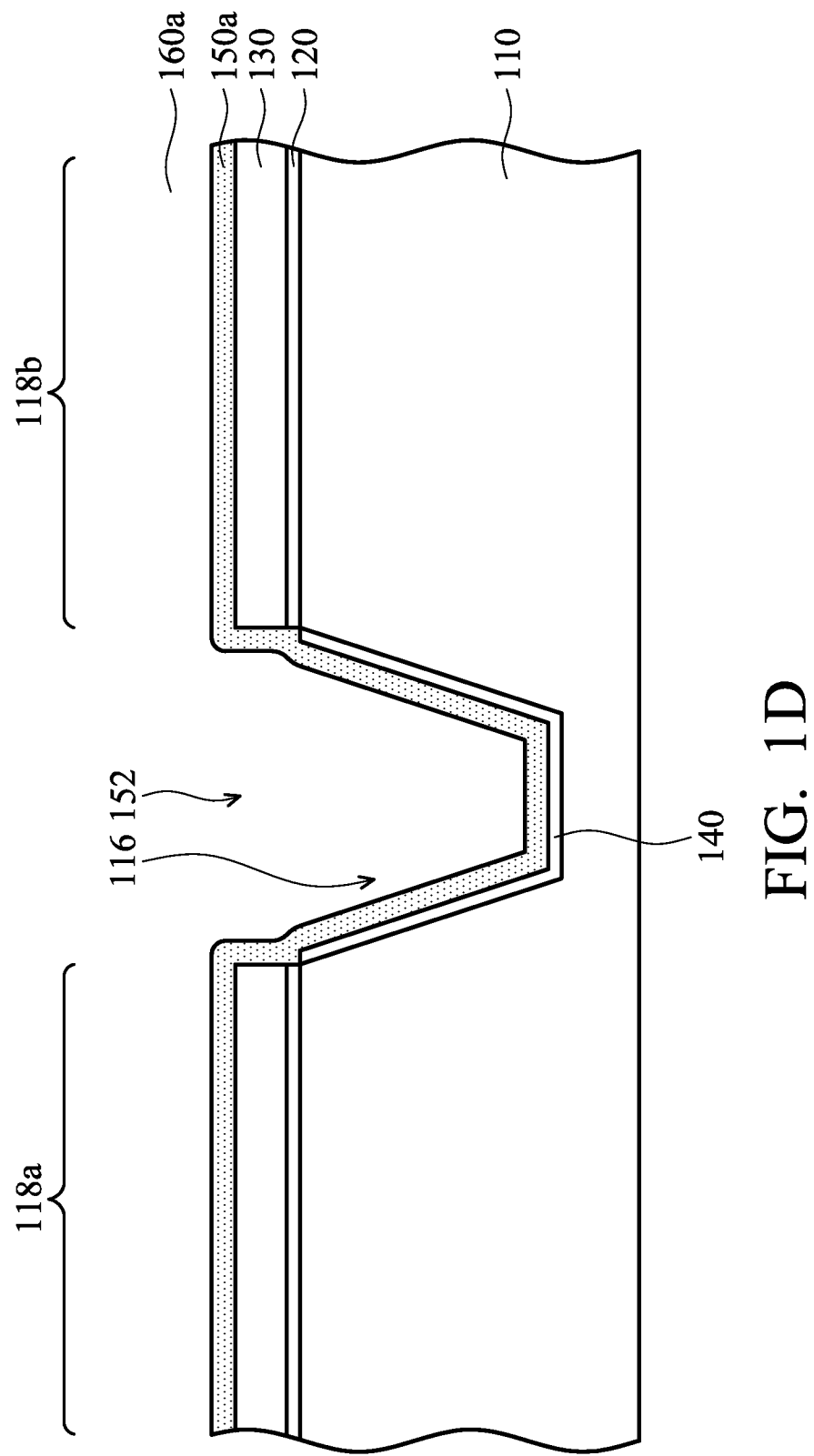

As shown in FIG. 1D, an insulating material layer 150a is formed over the mask layers 120 and 130 and the liner layer 140, in accordance with some embodiments. The insulating material layer 150a conformally covers the mask layers 120 and 130 and the liner layer 140, in accordance with some embodiments. The insulating material layer 150a has a trench 152 in the trench 116, in accordance with some embodiments.

The insulating material layer 150a includes oxide (such as silicon oxide), in accordance with some embodiments. The insulating material layer 150a is formed using a chemical vapor deposition process, in accordance with some embodiments. The chemical vapor deposition process includes an atomic layer deposition process, in accordance with some embodiments.

Figure 1E:
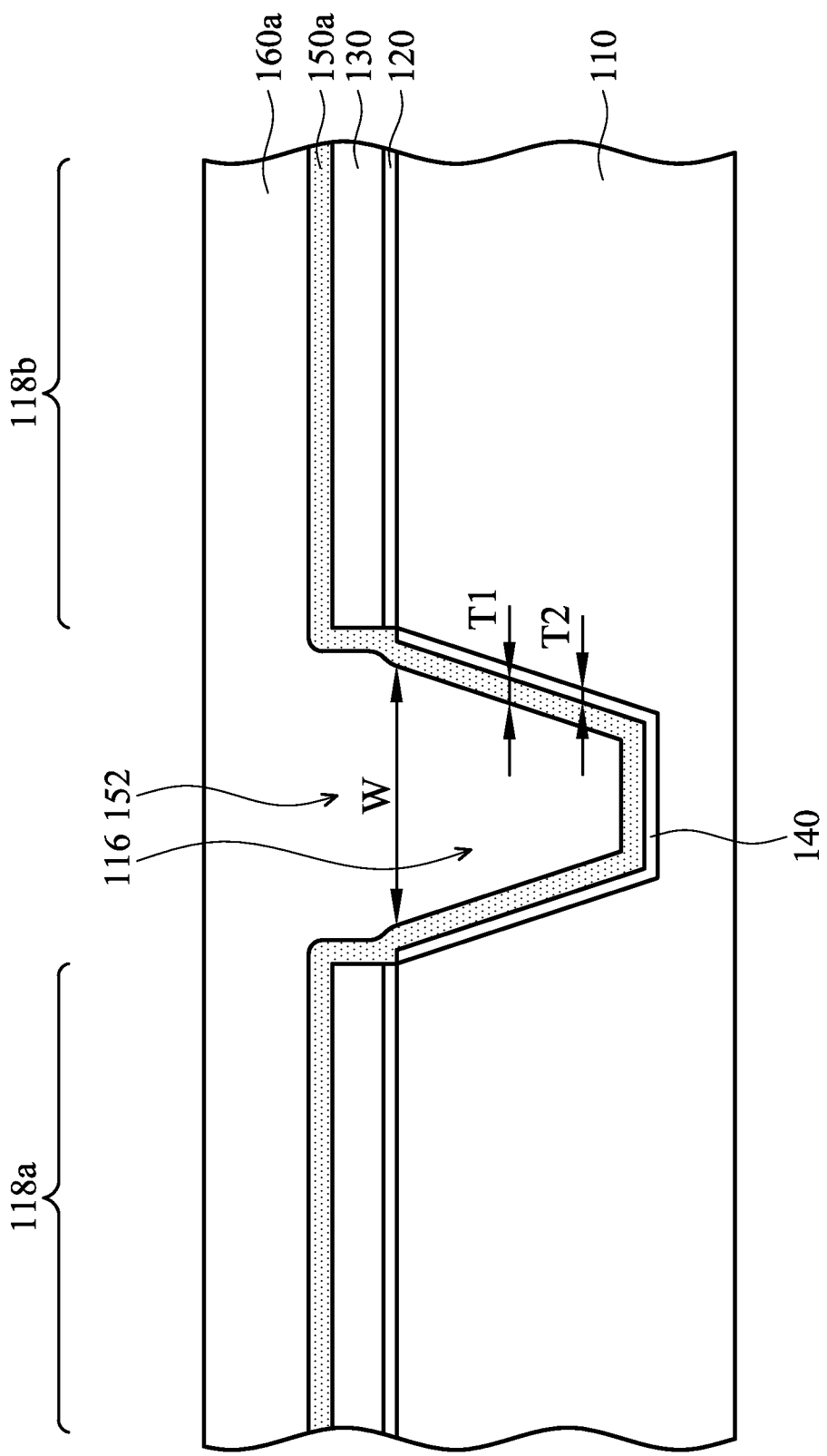

As shown in FIG. 1E, an isolation material layer 160a is formed over the insulating material layer 150a, in accordance with some embodiments. The isolation material layer 160a fills the trench 152, in accordance with some embodiments. The isolation material layer 160a includes oxide (such as silicon oxide), in accordance with some embodiments. The isolation material layer 160a is formed by a flowable chemical vapor deposition (FCVD) process, in accordance with some embodiments.

The flowable chemical vapor deposition process uses a silicon-containing material as a precursor, in accordance with some embodiments. The silicon-containing material includes silyl-amines such as $N(SiH_3)_3$ (i.e., TSA), $HN(SiH_3)_2$ (i.e., DSA), $H_2N(SiH_3)$, or other silyl-amines. Therefore, the isolation material layer 160a further includes nitrogen, in accordance with some embodiments.

Thereafter, an annealing process is performed over the isolation material layer 160a, in accordance with some embodiments. The annealing temperature of the annealing process ranges from about 900° C. to about 1300 t, in accordance with some embodiments. The annealing process may result in the deformation of the isolation material layer 160a, which may result in the deformation of the trench 116 and the active regions 118a and 118b.

The isolation material layer 160a and the insulating material layer 150a are formed by different deposition methods, in accordance with some embodiments. In some embodiments, the isolation material layer 160a is formed by a FCVD process, and the insulating material layer 150a is formed by an ALD process. Since the isolation material layer 160a and the insulating material layer 150a are formed by different deposition methods, the insulating material layer 150a may effectively reduce the deformation of the isolation material layer 160a during the annealing process. Therefore, the deformation of the trench 116 and the active regions 118a and 118b is also significantly reduced or is avoided.

The insulating material layer 150a has a thickness T1, in accordance with some embodiments. The liner layer 140 has a thickness T2, in accordance with some embodiments. The thickness T1 is greater than the thickness T2, in accordance with some embodiments. A ratio (T1/T2) of the thickness T1 to the thickness T2 ranges from about 2 to about 13, in accordance with some embodiments. The thickness T1 ranges from about 100 Å to about 500 Å, in accordance with some embodiments.

If the thickness T1 is too small (such as less than about 100 Å or less than the thickness T2), the insulating material layer 150a may be unable to effectively reduce the deformation of the isolation material layer 160a. If the thickness T1 is too large (such as larger than about 500 Å), it may take too long to form the insulating material layer 150a.

The isolation material layer 160a in the trench 116 has a maximum width W, in accordance with some embodiments. A ratio (T1/W) of the thickness T1 to the maximum width W ranges from about 0.16 to about 0.83, in accordance with some embodiments. If the ratio (T1/W) is too small (such as less than about 0.16), the insulating material layer 150a may be unable to effectively reduce the deformation of the isolation material layer 160a. If the ratio (T1/W) is too large (such as larger than about 0.83), it may take too long to form the insulating material layer 150a.

Figure 1F:
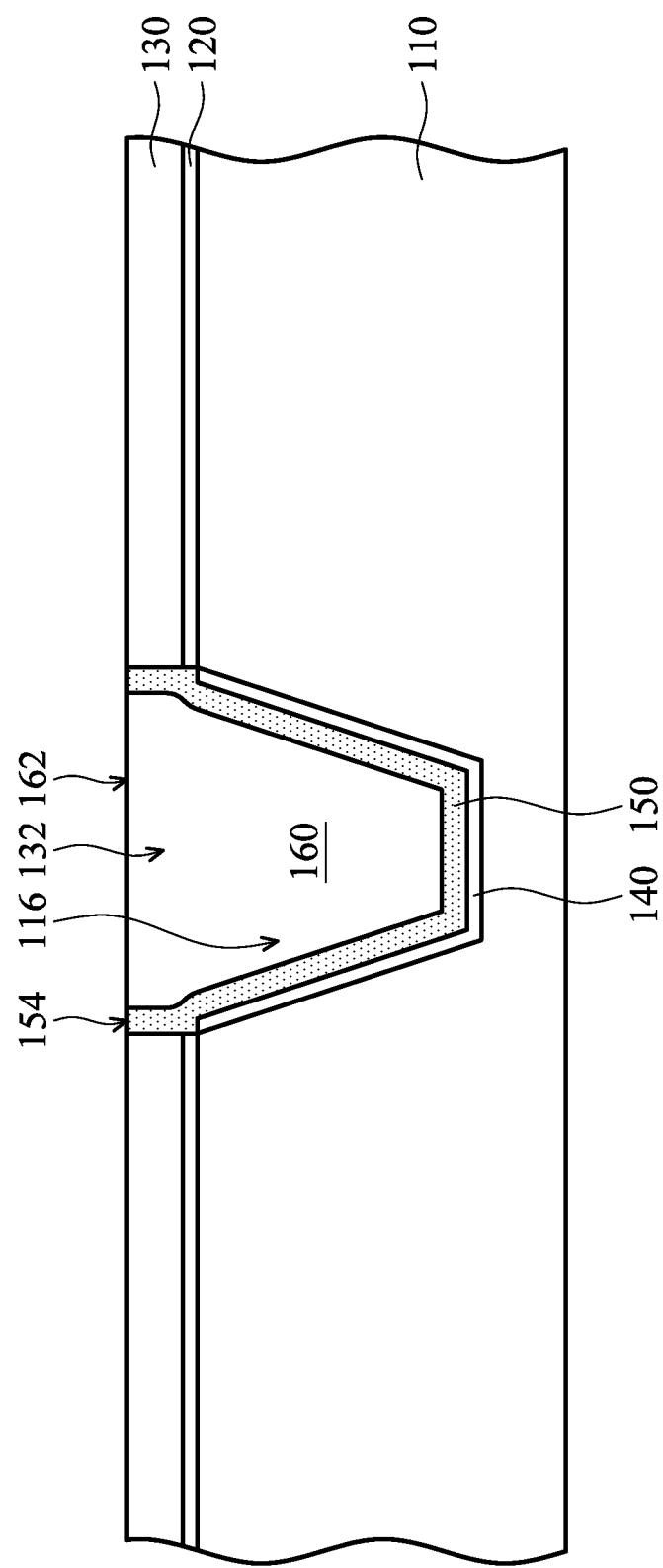

As shown in FIG. 1F, portions of the insulating material layer 150a and the isolation material layer 160a over the mask layer 130 are removed, in accordance with some embodiments. The removal process includes a planarization process (such as a chemical mechanical polishing process), in accordance with some embodiments.

After the removal process, the insulating material layer 150a remaining in the trench 116 and the opening 132 forms an insulating layer 150, in accordance with some embodiments. The isolation material layer 160a remaining in the trench 116 and the opening 132 forms an isolation layer 160, in accordance with some embodiments. In some embodiments, an upper surface 154 of the insulating layer 150 is aligned with an upper surface 162 of the isolation layer 160.

Figure 1G:
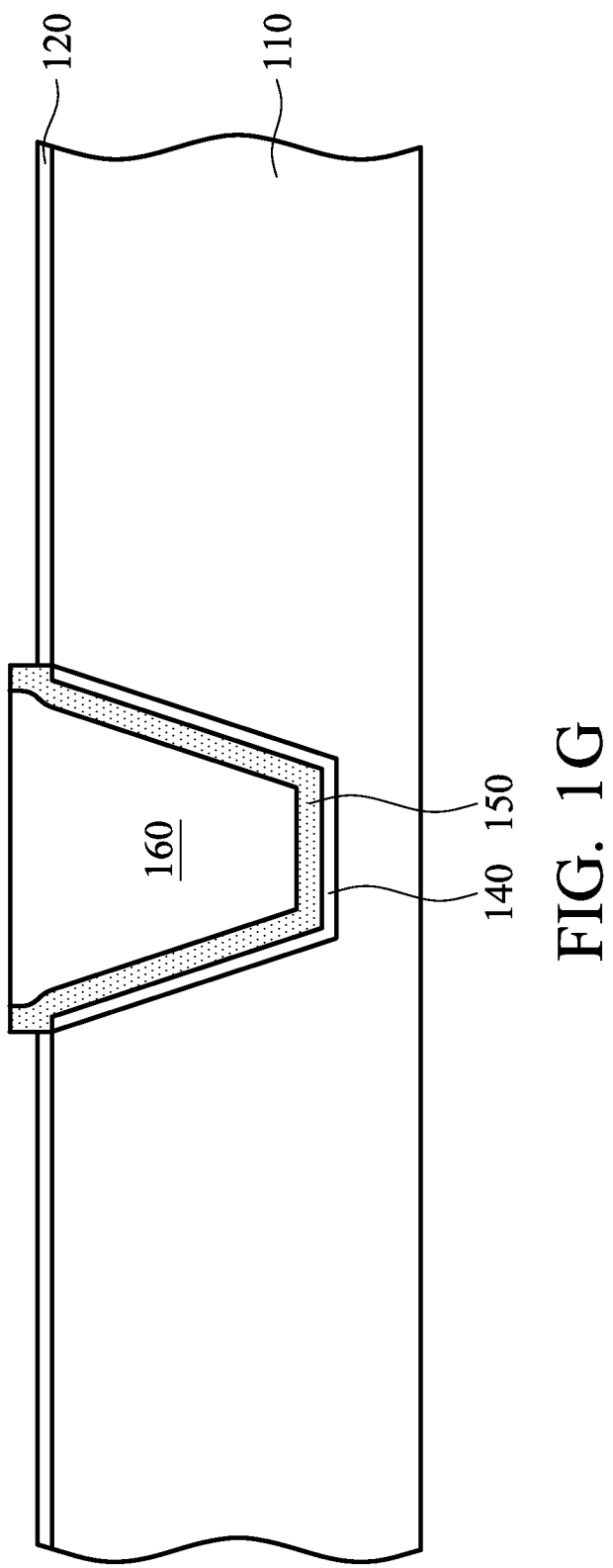
Figure 1H:
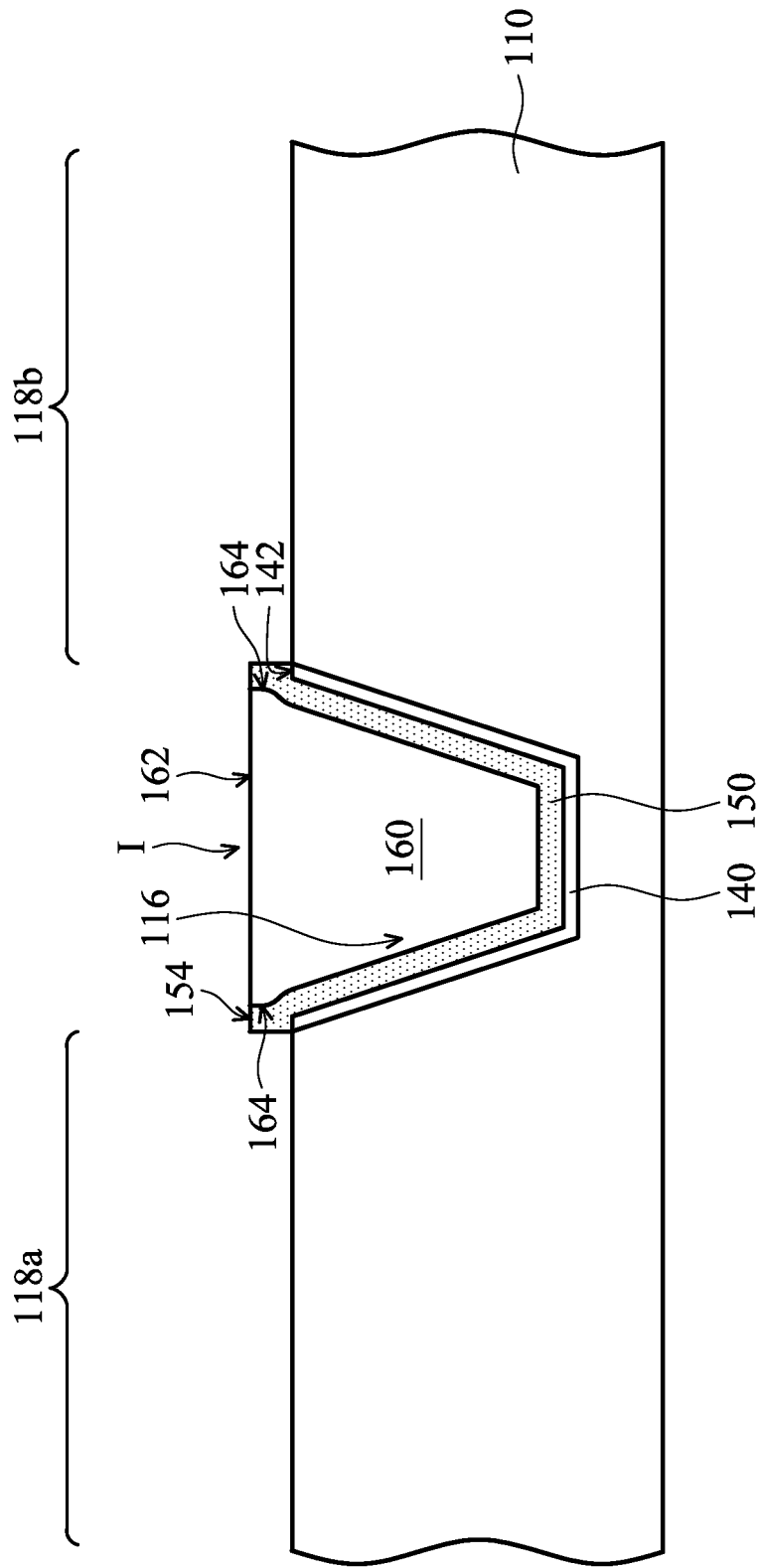

As shown in FIG. 1G, the mask layer 130 is removed, in accordance with some embodiments. The removal process includes a wet etching process, in accordance with some embodiments. As shown in FIG. 1H, the mask layer 120 is removed, in accordance with some embodiments. The removal process includes a dry etching process and a wet etching process, in accordance with some embodiments. In some embodiments, the removal process also removes upper portions of the isolation layer 160 and the insulating layer 150.

In this step, an isolation structure I is substantially formed, in accordance with some embodiments. The isolation structure I includes the liner layer 140, the insulating layer 150, and the isolation layer 160, in accordance with some embodiments. In the isolation structure I, a portion of the insulating layer 150 is outside of the trench 116 and covers an upper surface 142 of the liner layer 140, in accordance with some embodiments.

The insulating layer 150 outside of the trench 116 covers sidewalls 164 of the isolation layer 160 outside of the trench 116, in accordance with some embodiments. The insulating layer 150 separates the isolation layer 160 from the liner layer 140, in accordance with some embodiments. The isolation structure I fills the trench 116, in accordance with some embodiments.

Since the insulating layer 150 is able to effectively reduce the deformation of the isolation layer 160 during the annealing process, the deformation of the trench 116 and the active regions 118a and 118b is significantly reduced or avoided. Therefore, the alignment of subsequent processes (such as photolithography processes) performed in the active regions 118a and 118b is improved, which improves the yield of devices formed by the subsequent processes. A detailed description of exemplary subsequent processes is provided below.

Figure 1I:
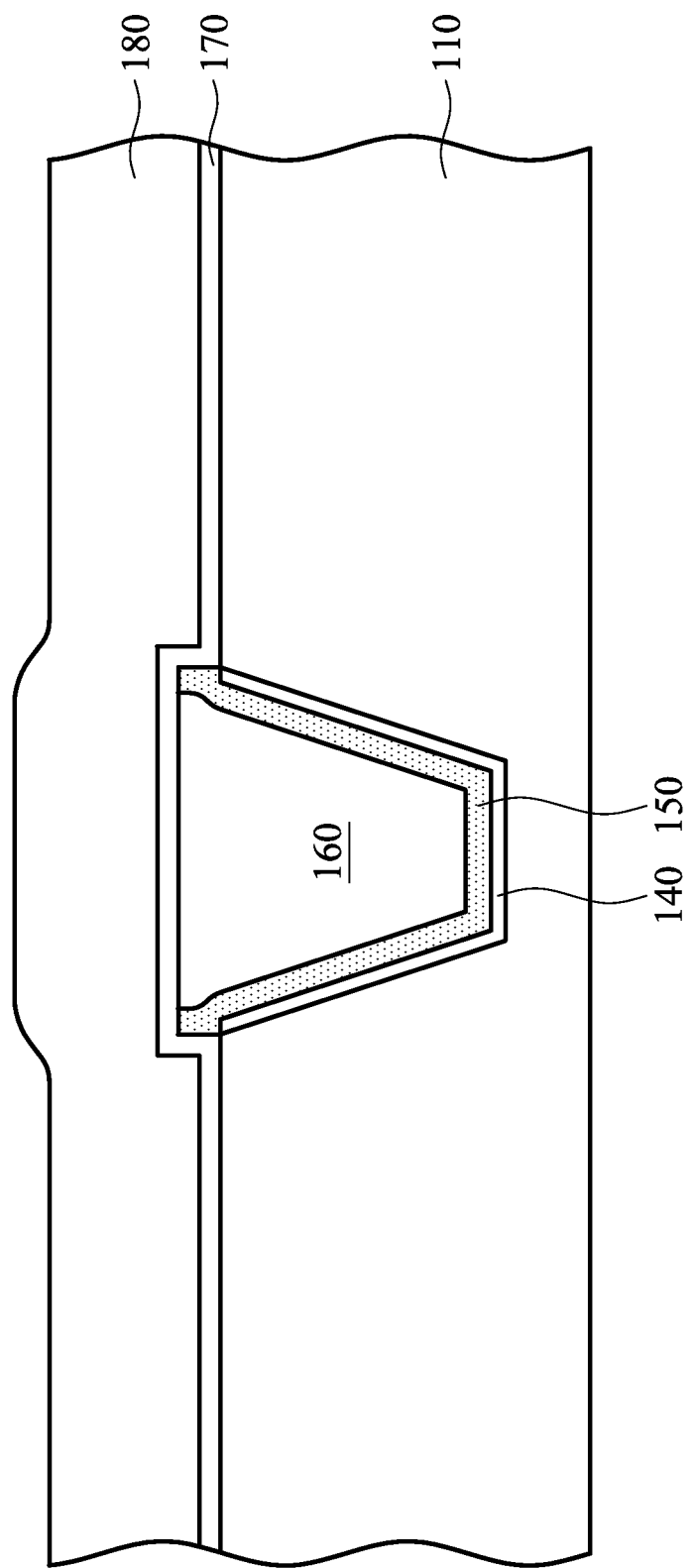

As shown in FIG. 1I, a gate dielectric material layer 170 is deposited over the substrate 110, in accordance with some embodiments. The gate dielectric material layer 170 is deposited by, for example, a chemical vapor deposition process (CVD process). Thereafter, as shown in FIG. 1I, a gate material layer 180 is deposited over the gate dielectric material layer 170, in accordance with some embodiments. The gate material layer 180 is deposited using a CVD process, in accordance with some embodiments.

Figure 1J:
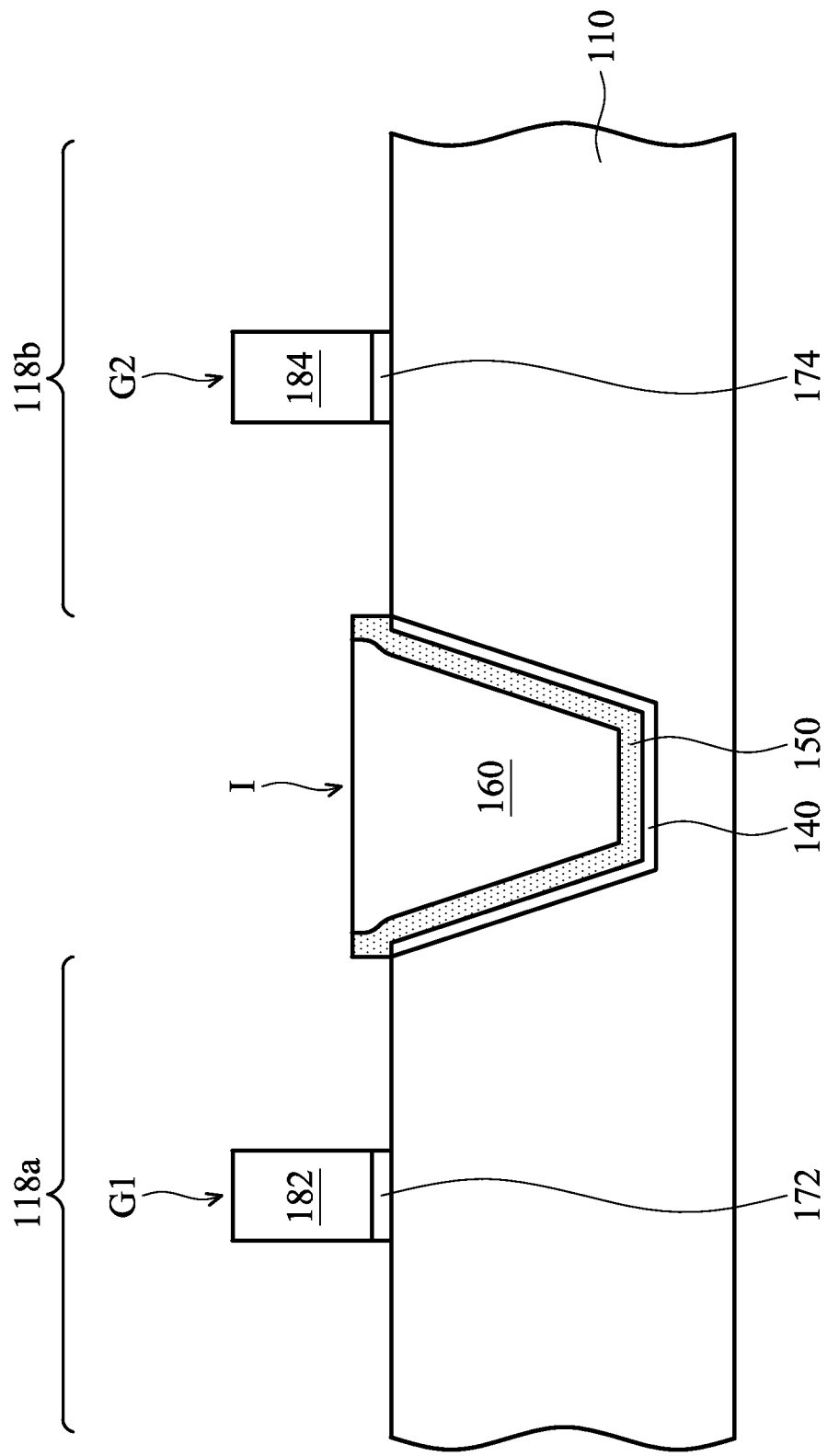

As shown in FIG. 1J, portions of the gate dielectric material layer 170 and the gate material layer 180 are removed, in accordance with some embodiments. The remaining gate dielectric material layer 170 forms gate dielectric layers 172 and 174 over the active regions 118a and 118b, respectively, in accordance with some embodiments. The remaining gate material layer 180 forms gates 182 and 184 over the gate dielectric layers 172 and 174, respectively, in accordance with some embodiments.

The gate 182 and the gate dielectric layer 172 together form a gate stack G1, in accordance with some embodiments. The gate 184 and the gate dielectric layer 174 together form a gate stack G2, in accordance with some embodiments. The removal process includes a photolithography process and an etching process, in accordance with some embodiments.

Since the insulating layer 150 prevents the active regions 118a and 118b from deformation (or reduce the deformation of the active regions 118a and 118b), the alignment of the photolithography process is improved, in accordance with some embodiments. Therefore, the gates 182 and 184 are formed over predetermined positions accurately, in accordance with some embodiments.

Figure 1K:
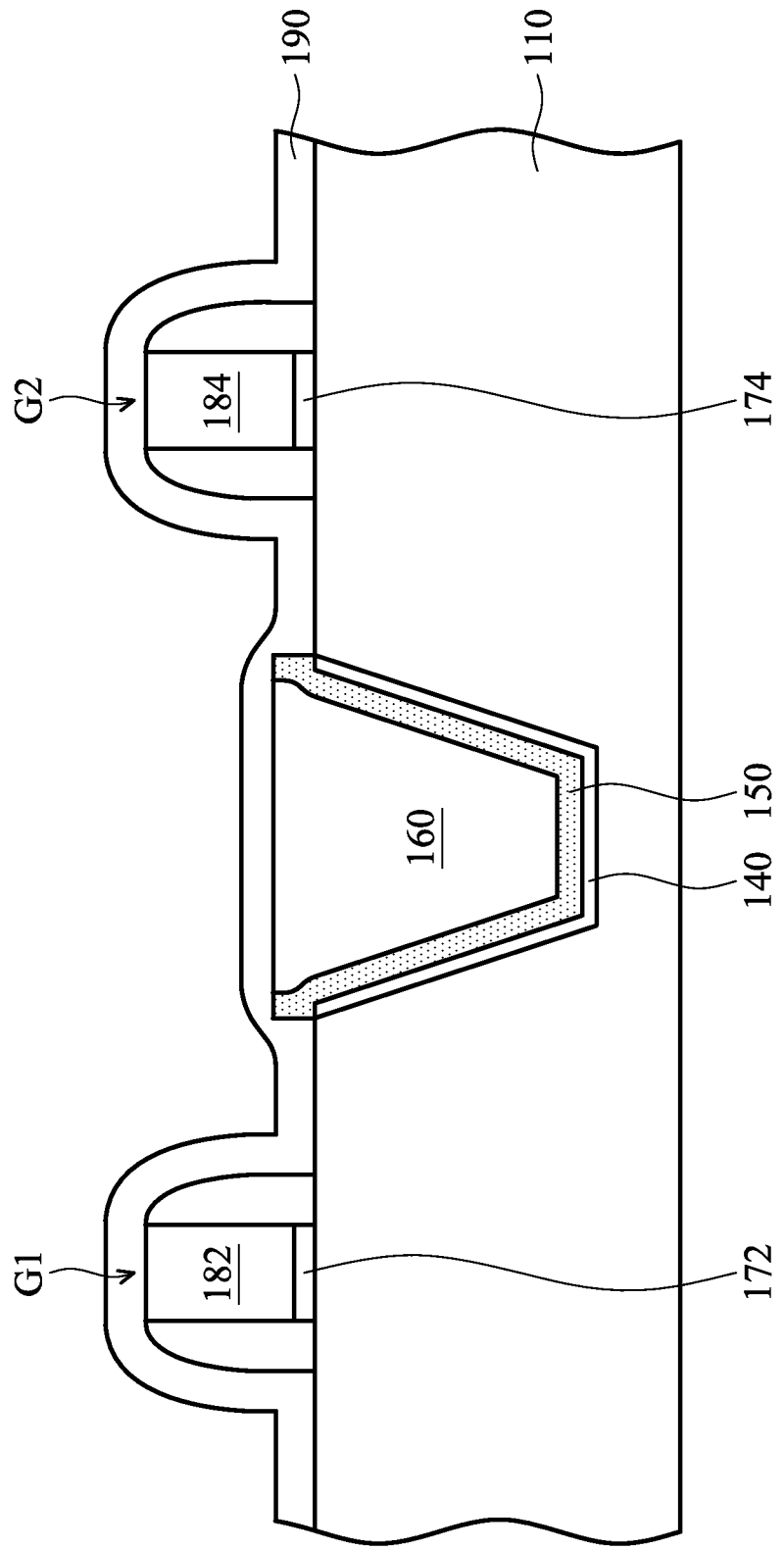

As shown in FIG. 1K, a spacer layer 190 is deposited over the substrate 110 to cover the gate stacks G1 and G2, in accordance with some embodiments. The spacer layer 190 is deposited using a CVD process, in accordance with some embodiments. The spacer layer 190 includes insulating materials, such as silicon oxide or silicon nitride, in accordance with some embodiments.

Figure 1L:
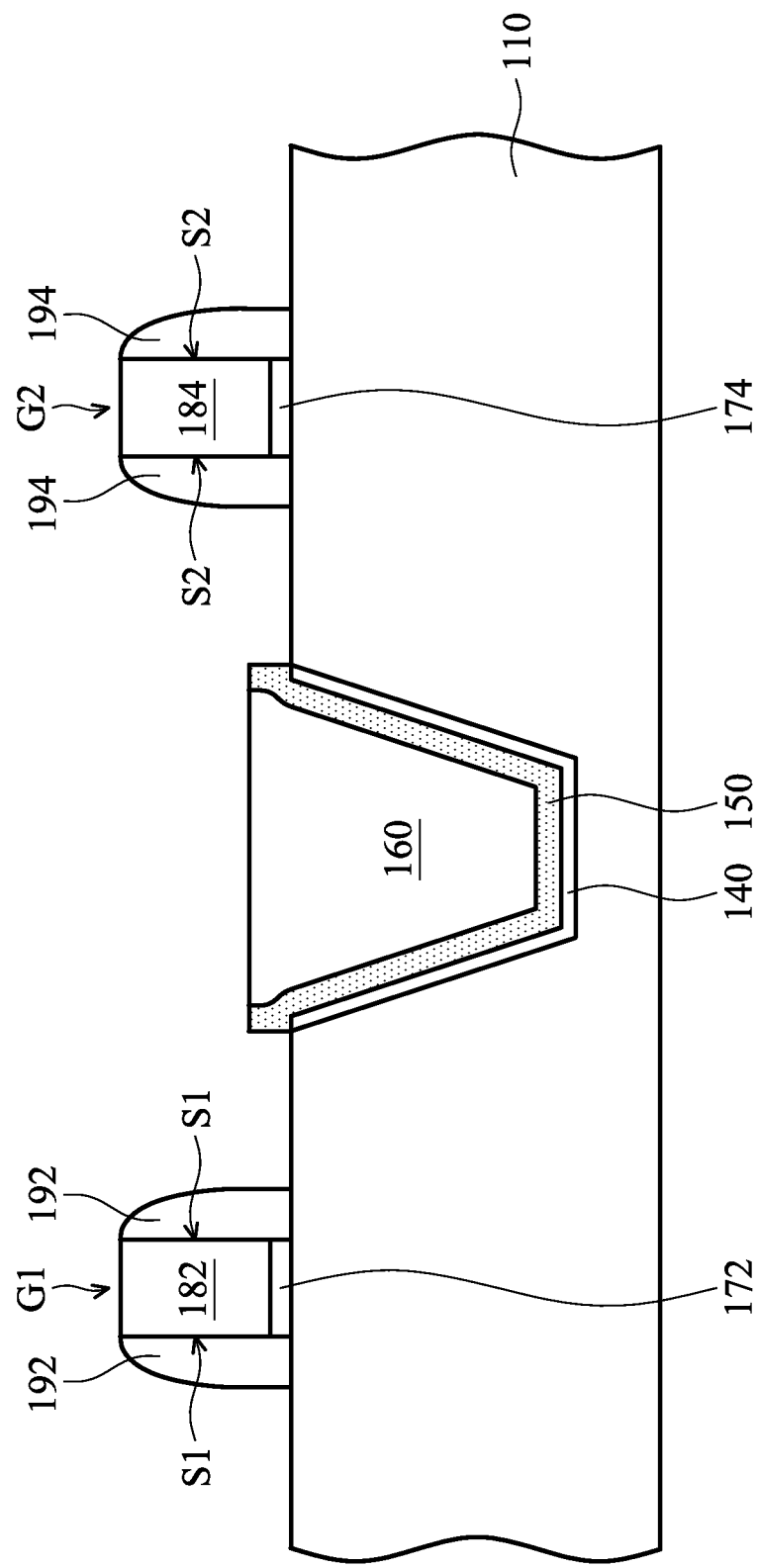

As shown in FIG. 1L, a portion of the spacer layer 190 is removed, in accordance with some embodiments. The spacer layer 190 remaining over the sidewalls S1 of the gate stack G1 forms spacers 192, in accordance with some embodiments. The spacer layer 190 remaining over the sidewalls S2 of the gate stack G2 forms spacers 194, in accordance with some embodiments.

The spacers 192 and 194 over the sidewalls S1 and S2 are configured to electrically isolate the gates 182 and 184 from other devices and to act as a mask layer in a subsequent ion implantation process, in accordance with some embodiments. The removal process includes an anisotropic etching process (such as a dry etching process), in accordance with some embodiments.

Figure 1M:
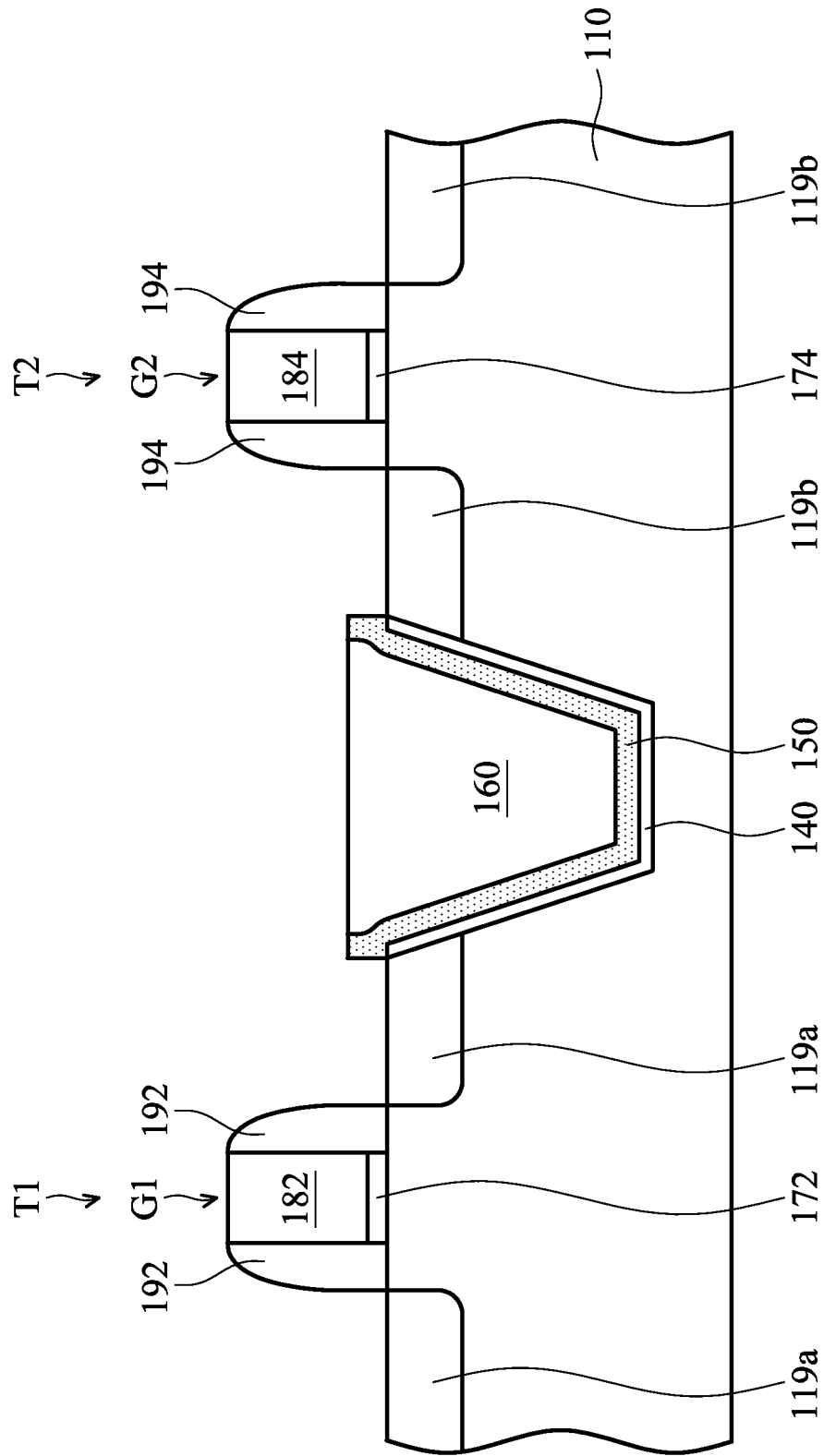

As shown in FIG. 1M, doped regions 119a and 119b are formed in the semiconductor substrate 110, in accordance with some embodiments. The formation of the doped regions 119a and 119b includes as an ion implantation process, in accordance with some embodiments. The ion implantation process is performed to introduce p-type impurities (e.g., boron) or n-type impurities (e.g., phosphorus) into the semiconductor substrate 110, in accordance with some embodiments.

The doped regions 119a are a doped source region and a doped drain region, in accordance with some embodiments. The gate stack G1 is located between the doped regions 119a, in accordance with some embodiments. The gate stack G1, the spacers 192, and the doped regions 119a constitute a transistor device T1, in accordance with some embodiments.

The doped regions 119b are a doped source region and a doped drain region, in accordance with some embodiments. The doped regions 119b are located at the two opposite sides of the gate stack G2, in accordance with some embodiments. The gate stack G2, the spacers 194, and the doped regions 119b constitute a transistor device T2, in accordance with some embodiments. Since the insulating layer 150 helps the gates 182 and 184 to be formed over the predetermined positions accurately, the yield of the transistor devices T1 and T2 is improved, in accordance with some embodiments.

In some embodiments, the gates 182 and 184 of the transistor devices T1 and T2 are replaced by metal gates. A detailed description of an exemplary replacement process is provided below.

FIGS. 2A-2H are cross-sectional views of various stages of a process for forming a semiconductor device structure, in accordance with some embodiments.

Figure 2A:
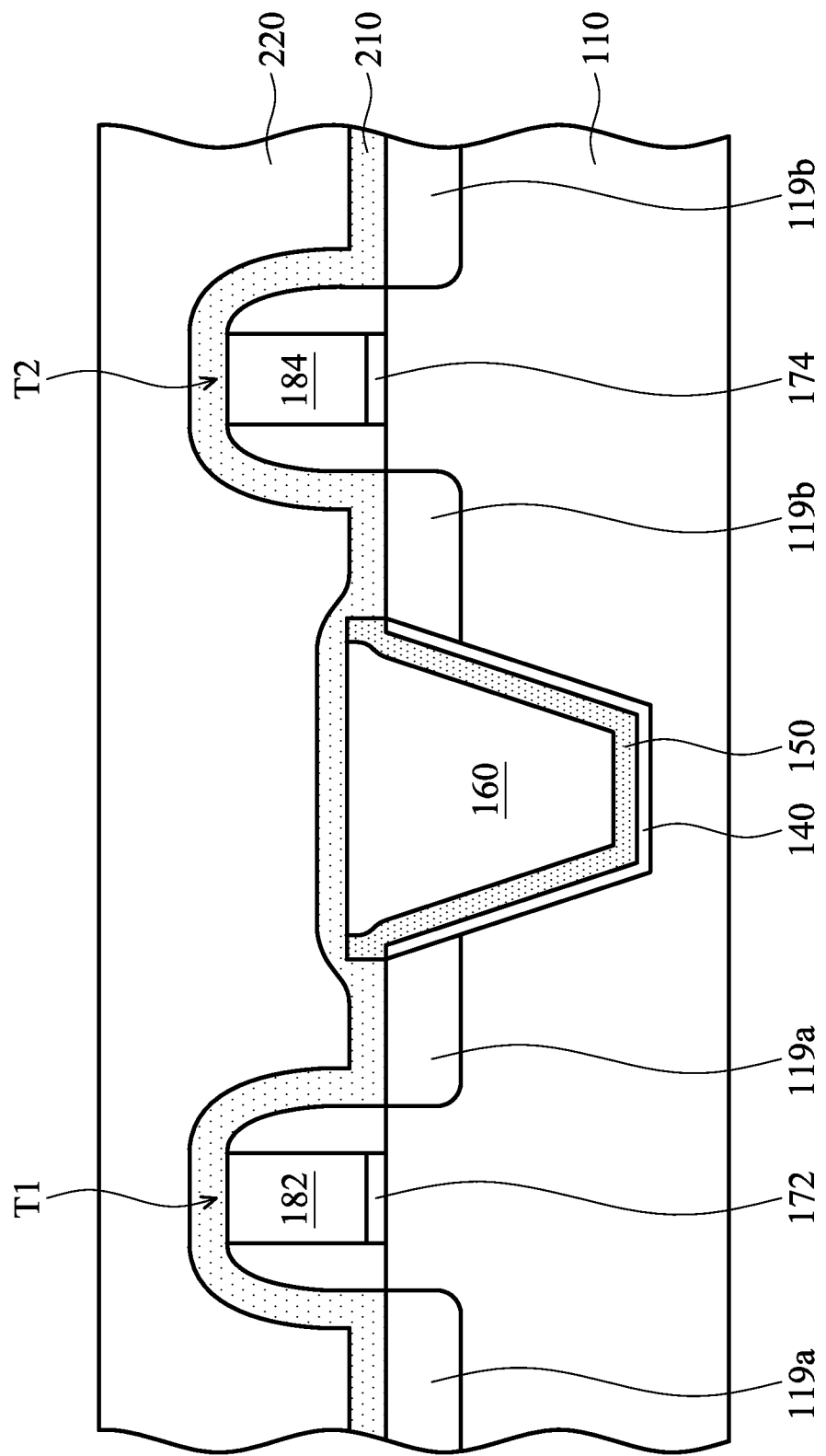
FIGS. 2A-2H are cross-sectional views of various stages of a process for forming a semiconductor device structure, in accordance with some embodiments.

After the step of FIG. 1M, as shown in FIG. 2A, a contact etch stop layer 210 is formed over the semiconductor substrate 110 and the transistor devices T1 and T2, in accordance with some embodiments. The contact etch stop layer 210 is in direct contact with the insulating layer 150 and the isolation layer 160, in accordance with some embodiments. The contact etch stop layer 210 includes a dielectric material, such as silicon nitride. In some embodiments, the contact etch stop layer 210 is not formed.

As shown in FIG. 2A, an insulating layer 220 is then deposited over the contact etch stop layer 210, in accordance with some embodiments. The insulating layer 220 is made of any suitable insulating material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. The insulating layer 220 is deposited by any suitable process, such as a CVD process, HDPCVD process, spin-on process, sputtering process, or a combination thereof.

Figure 2B:
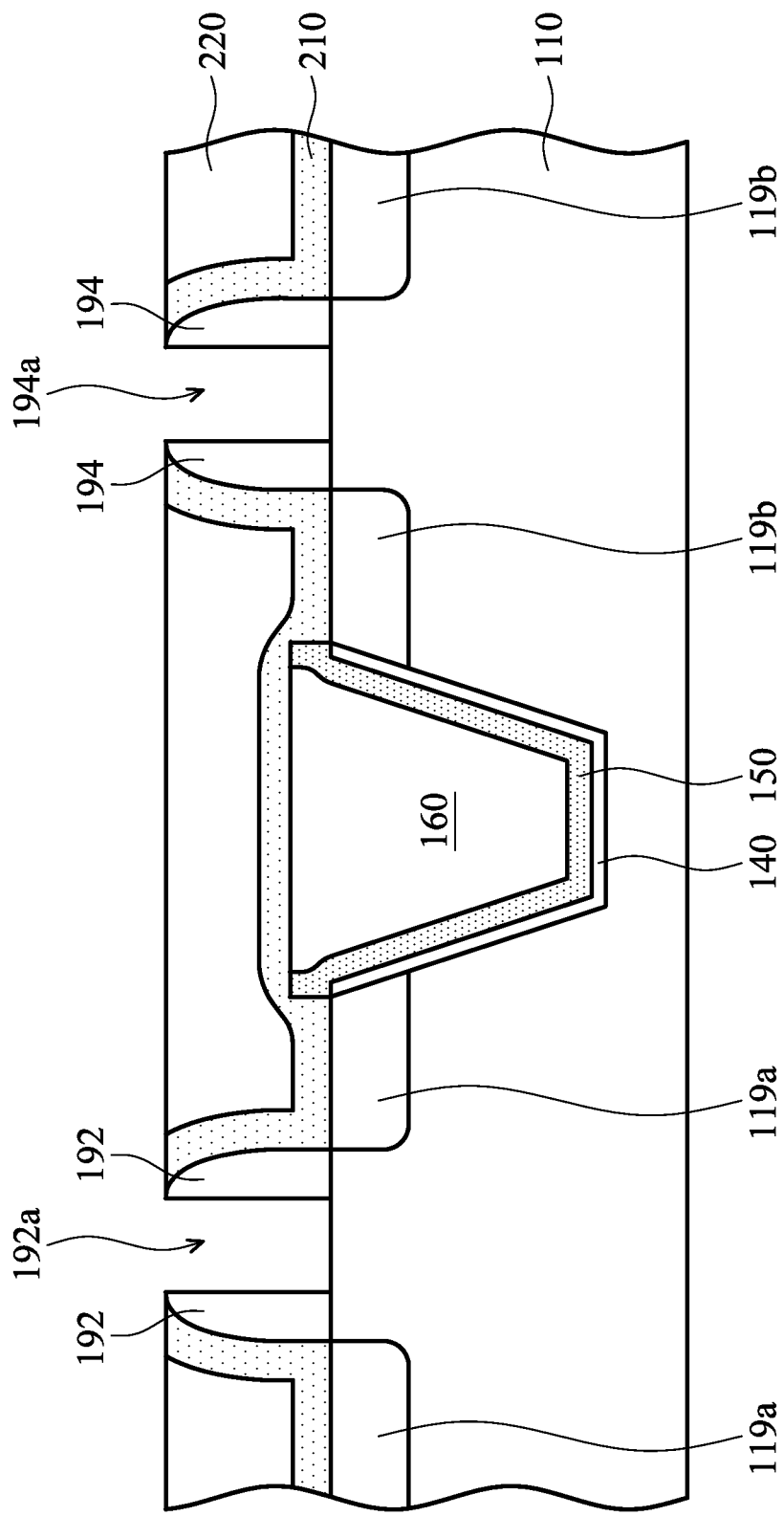

Afterwards, as shown in FIG. 2B, a planarization process is then performed on the insulating layer 220 and the contact etch stop layer 210 until top surfaces of the gates 182 and 184 are exposed, in accordance with some embodiments. The planarization process includes a chemical mechanical polishing (CMP) process, in accordance with some embodiments. After the planarization process is performed, the insulating layer 220 has a substantially planar surface to facilitate subsequent processes.

Thereafter, the gates 182 and 184 are removed, in accordance with some embodiments. The removal process includes a wet etching process, a dry etching process, or a combination thereof, in accordance with some embodiments. In some embodiments, the gate dielectric layers 172 and 174 are also removed. After the gates 182 and 184 and the gate dielectric layers 172 and 174 are removed, openings 192a and 194a are formed between the spacers 192 and between the spacers 194 respectively, in accordance with some embodiments. The openings 192a and 194a are trenches, in accordance with some embodiments.

Figure 2C:
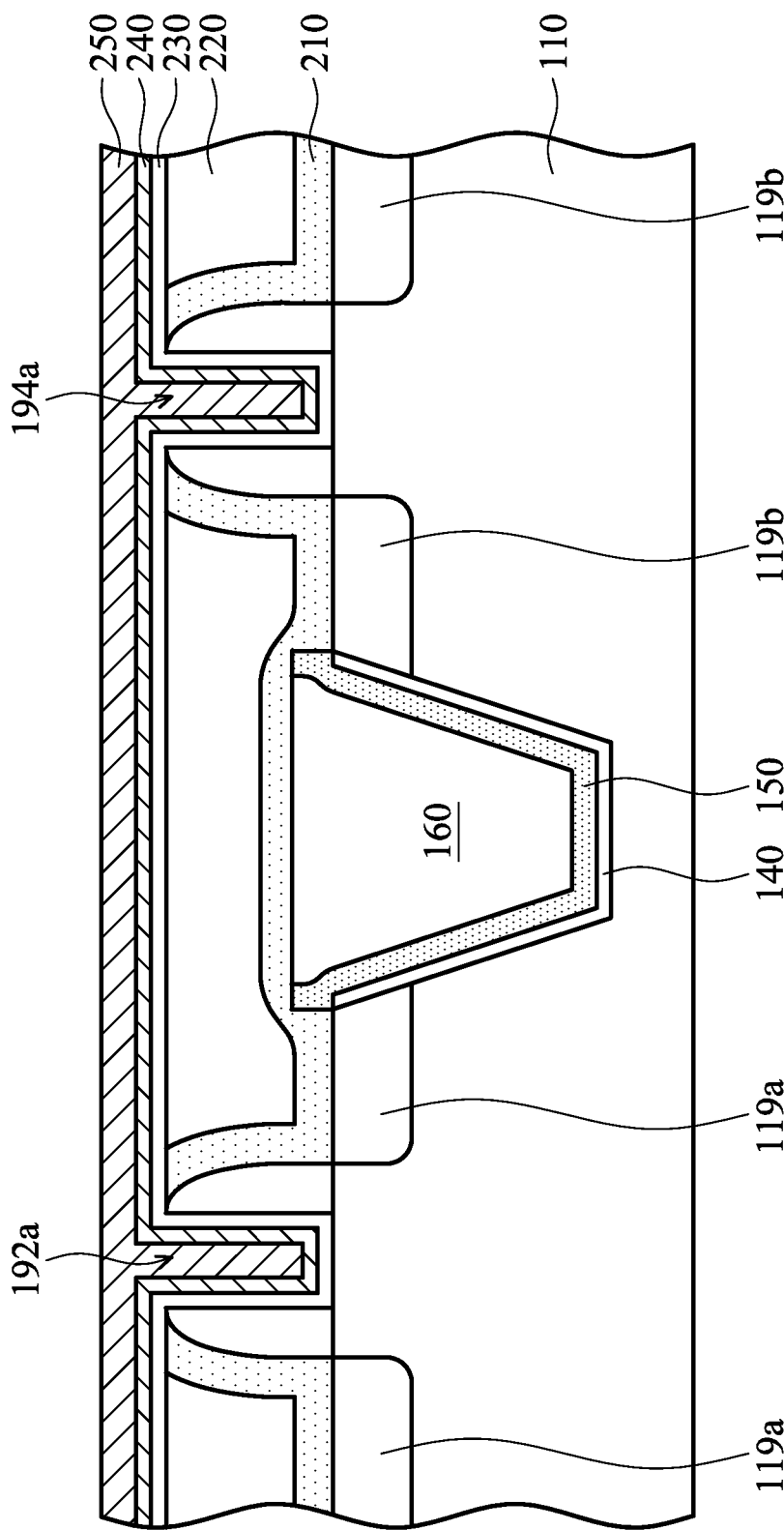

As shown in FIG. 2C, a gate dielectric layer 230 is formed to cover bottom surfaces of the openings 192a and 194a, in accordance with some embodiments. The gate dielectric layer 230 is made of a dielectric material, such as a high dielectric constant (high-k) material, in accordance with some embodiments. The high-k material is made of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or combinations thereof, in accordance with some embodiments.

In some embodiments, the high-k material is made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or combinations thereof.

The gate dielectric layer 230 is deposited by any suitable process, such as atomic layer deposition (ALD), chemical vapor deposition (CVD), physical vapor deposition (PVD), sputtering, plating, other suitable processes, or combinations thereof. In some embodiments, the gate dielectric layer 230 needs to be further annealed.

An intermediate dielectric layer (not shown) may be formed over the substrate 110 before the gate dielectric layer 230 is formed. The intermediate dielectric layer may be made of a suitable dielectric material, such as silicon oxide, hafnium silicate, silicon oxynitride, or a combination thereof, in accordance with some embodiments.

As shown in FIG. 2C, a work function metal layer 240 is deposited over the gate dielectric layer 230, in accordance with some embodiments. The work function metal layer 240 provides a desired work function for transistors to enhance device performance including improved threshold voltage. In the embodiments of forming an NMOS transistor, the work function metal layer 240 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

On the other hand, in the embodiments of forming a PMOS transistor, the work function metal layer 240 can be a p-type metal capable of providing a work function value suitable for the device, such as equal to or greater than about 4.8 eV. The p-type metal may be made of metal, metal carbide, metal nitride, other suitable materials, or a combination thereof. For example, the p-type metal is made of titanium, titanium nitride, other suitable materials, or combinations thereof.

The work function metal layer 240 may also be made of hafnium, zirconium, titanium, tantalum, aluminum, metal carbides (e.g., hafnium carbide, or zirconium carbide), aluminides, ruthenium or a combination thereof. The work function metal layer 240 may be deposited by using a PVD process, CVD process, ALD process, plating process, another suitable method, or a combination thereof.

As shown in FIG. 2C, a gate electrode layer 250 (also called a metal gate electrode layer) is deposited over the work function metal layer 240 to fill the openings 192a and 194a, in accordance with some embodiments. The gate electrode layer 250 is made of a suitable metal material, such as aluminum, tungsten, gold, platinum, cobalt, other suitable metal, an alloy thereof, or a combination thereof, in accordance with some embodiments. The gate electrode layer 250 is deposited by using a PVD process, CVD process, plating process, the like, or a combination thereof, in accordance with some embodiments.

Figure 2D:
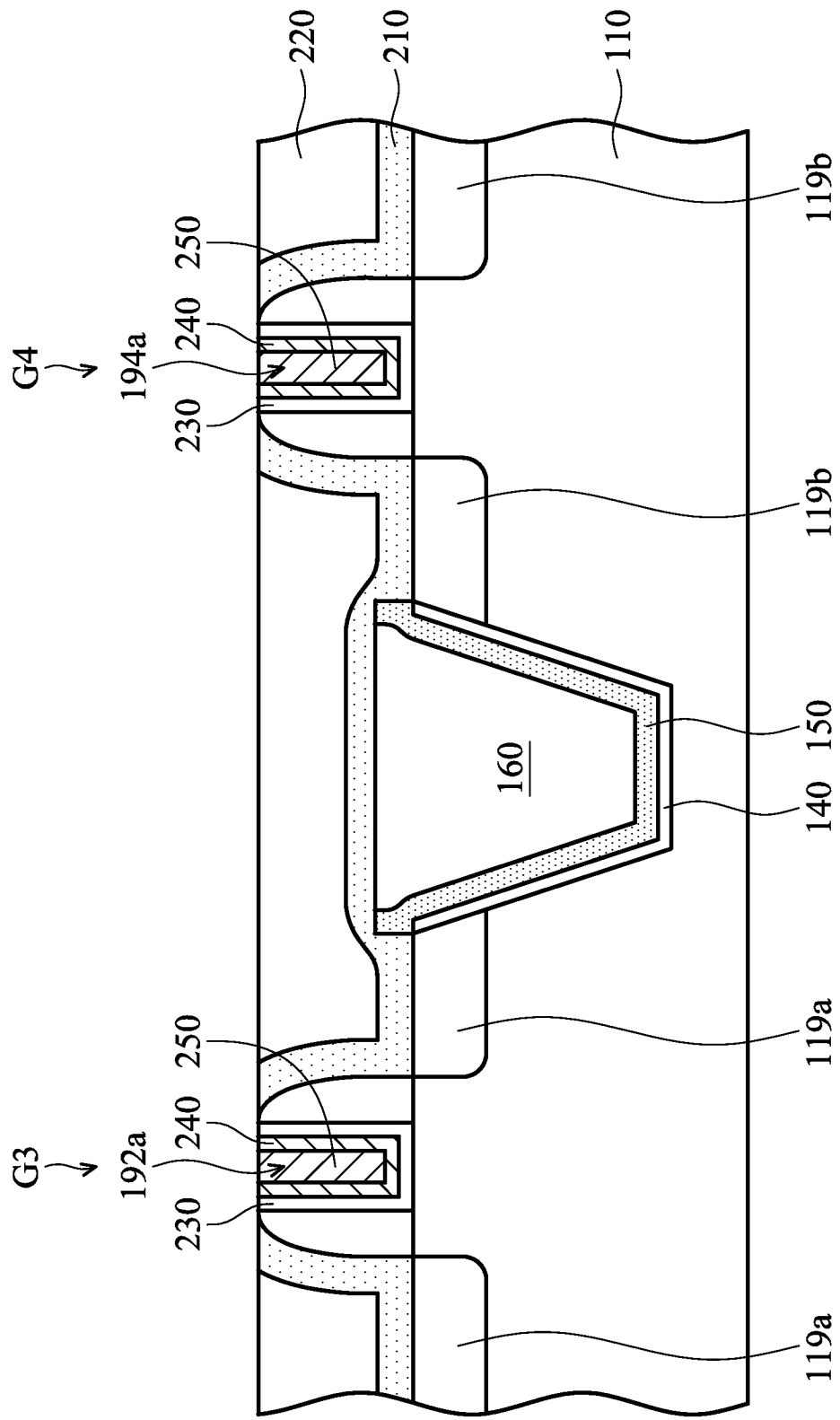

Afterwards, as shown in FIG. 2D, a planarization process is performed to remove the gate electrode layer 250, the work function metal layer 240, and the gate dielectric layer 230 outside of the openings 192a and 194a, in accordance with some embodiments. The planarization process includes a chemical mechanical polishing (CMP) process or the like, in accordance with some embodiments.

The gate electrode layer 250, the work function metal layer 240, and the gate dielectric layer 230 remaining in the opening 192a together form a gate stack G3 (i.e., a metal gate stack), which is surrounded by the insulating layer 220. The gate electrode layer 250 remaining in the opening 192a serves as a metal gate electrode of the gate stack G3, in accordance with some embodiments.

The gate electrode layer 250, the work function metal layer 240, and the gate dielectric layer 230 remaining in the opening 194a together form a gate stack G4 (i.e., a metal gate stack), which is surrounded by the insulating layer 220. The gate electrode layer 250 remaining in the opening 194a serves as a metal gate electrode of the gate stack G4, in accordance with some embodiments.

Figure 2E:
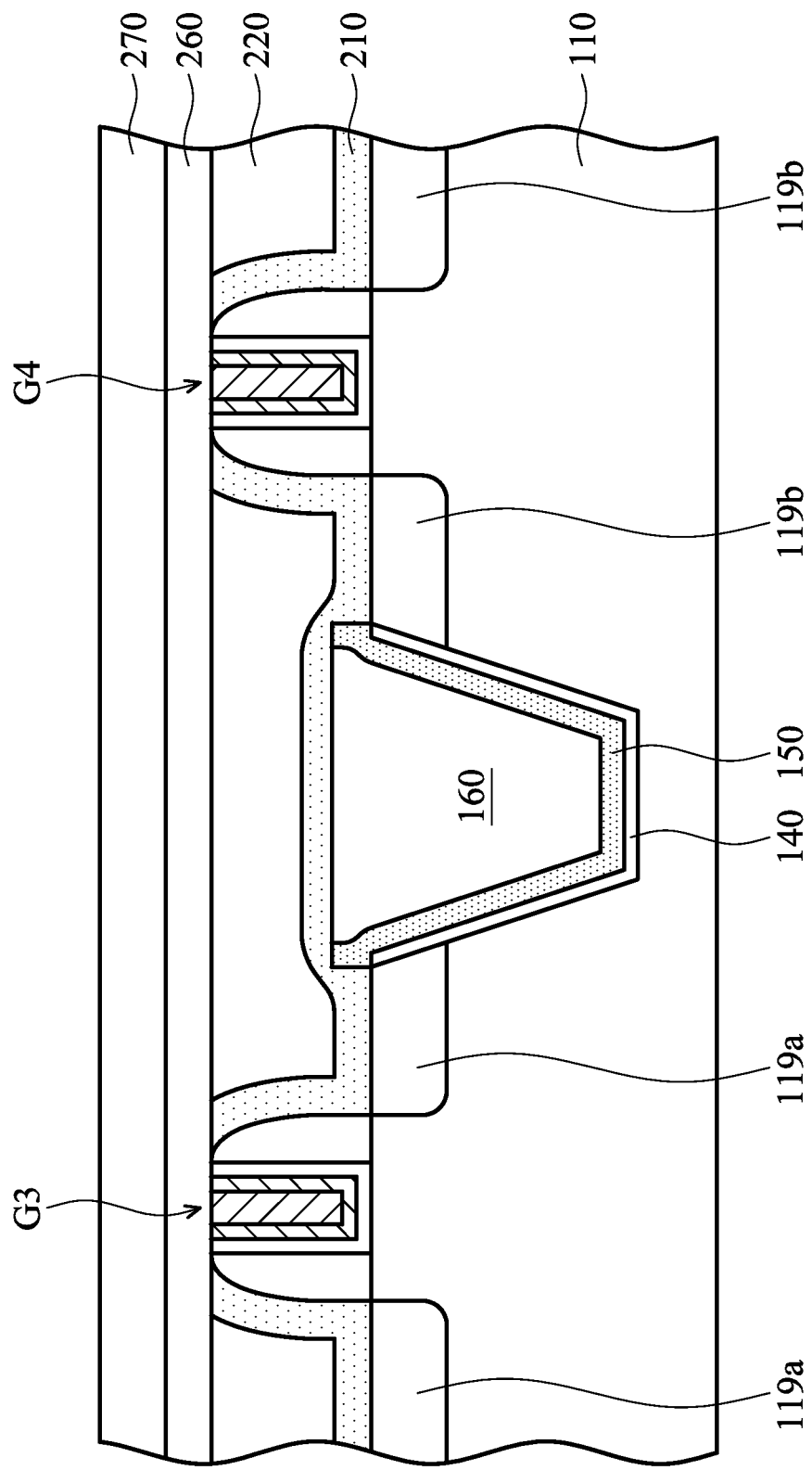

As shown in FIG. 2E, a contact etch stop layer 260 is deposited over the contact etch stop layer 210, the insulating layer 220, and the gate stacks G3 and G4, in accordance with some embodiments. The contact etch stop layer 260 is made of silicon nitride or other suitable materials.

As shown in FIG. 2E, a protective layer 270 is formed over the contact etch stop layer 260 in accordance with some embodiments. The protective layer 270 is configured to protect the contact etch stop layer 260 from being damaged during a subsequent pre-amorphized implantation (PAI) process, in accordance with some embodiments. The protective layer 270 includes a plasma-enhanced oxide (PEOX) layer, in accordance with some embodiments.

Figure 2F:
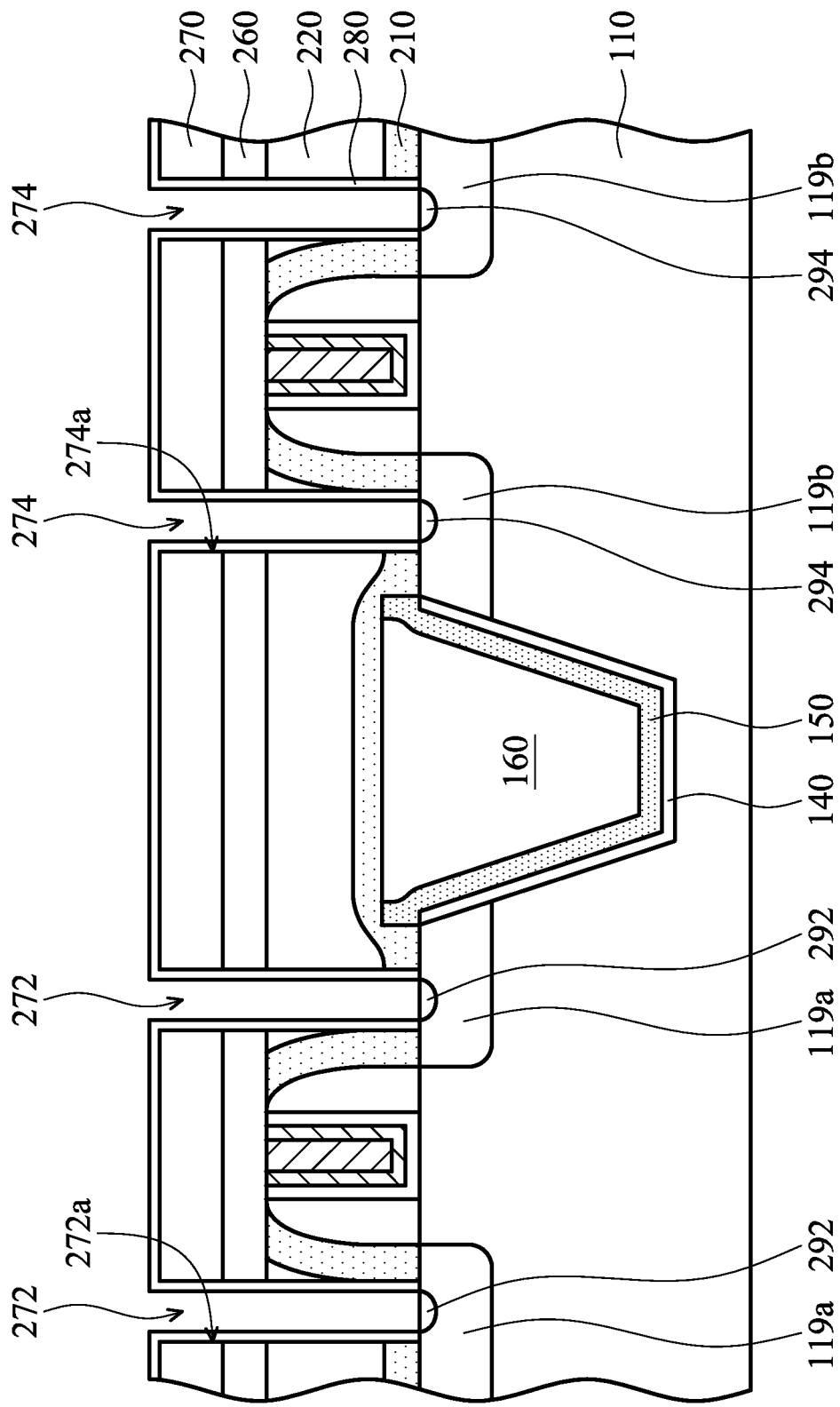

Afterwards, as shown in FIG. 2F, the protective layer 270, the contact etch stop layer 260, the insulating layer 220, and the contact etch stop layer 210 are patterned to form contact openings 272 and 274 exposing the doped regions 119a and 119b, respectively, in accordance with some embodiments. The formation of the contact openings 272 and 274 includes a photolithography process and an etching process, in accordance with some embodiments.

Thereafter, as shown in FIG. 2F, a dielectric spacer liner (DSL) layer 280 is conformally formed over the protective layer 270 and inner walls 272a and 274a of the contact openings 272 and 274, in accordance with some embodiments. The DSL layer 280 is configured to protect the inner walls 272a and 274a from being damaged by the subsequent PAI process. The DSL layer 280 is made of, for example, SiOC or other suitable materials.

Afterwards, a pre-amorphized implantation (PAI) process is performed to reduce the dopant channeling effect and enhance dopant activation, in accordance with some embodiments. In some embodiments, silicon, germanium or carbon is used. In some other embodiments, inert gases, such as neon, argon, krypton, xenon, and/or radon, are used. Portions of the doped regions 119a and 119b exposed and located at bottoms of the openings 272 and 274 are turned into an amorphous state as a result of the PAI process, in accordance with some embodiments.

Thereafter, a salicidation (self-aligned silicidation) process is performed to form metal silicide structures 292 and 294 on/in the doped regions 119a and 119b respectively, in accordance with some embodiments. The material of the metal silicide structures 292 and 294 are made of nickel silicide, in accordance with some embodiments. In some embodiments, the metal silicide structures 292 and 294 are made of a silicide material of a suitable metal material. The suitable metal material may be cobalt (Co), platinum (Pt), titanium (Ti), ytterbium (Yb), molybdenum (Mo), erbium (Er), or a combination thereof, in accordance with some embodiments. In some embodiments, the salicidation process is not performed.

Figure 2G:
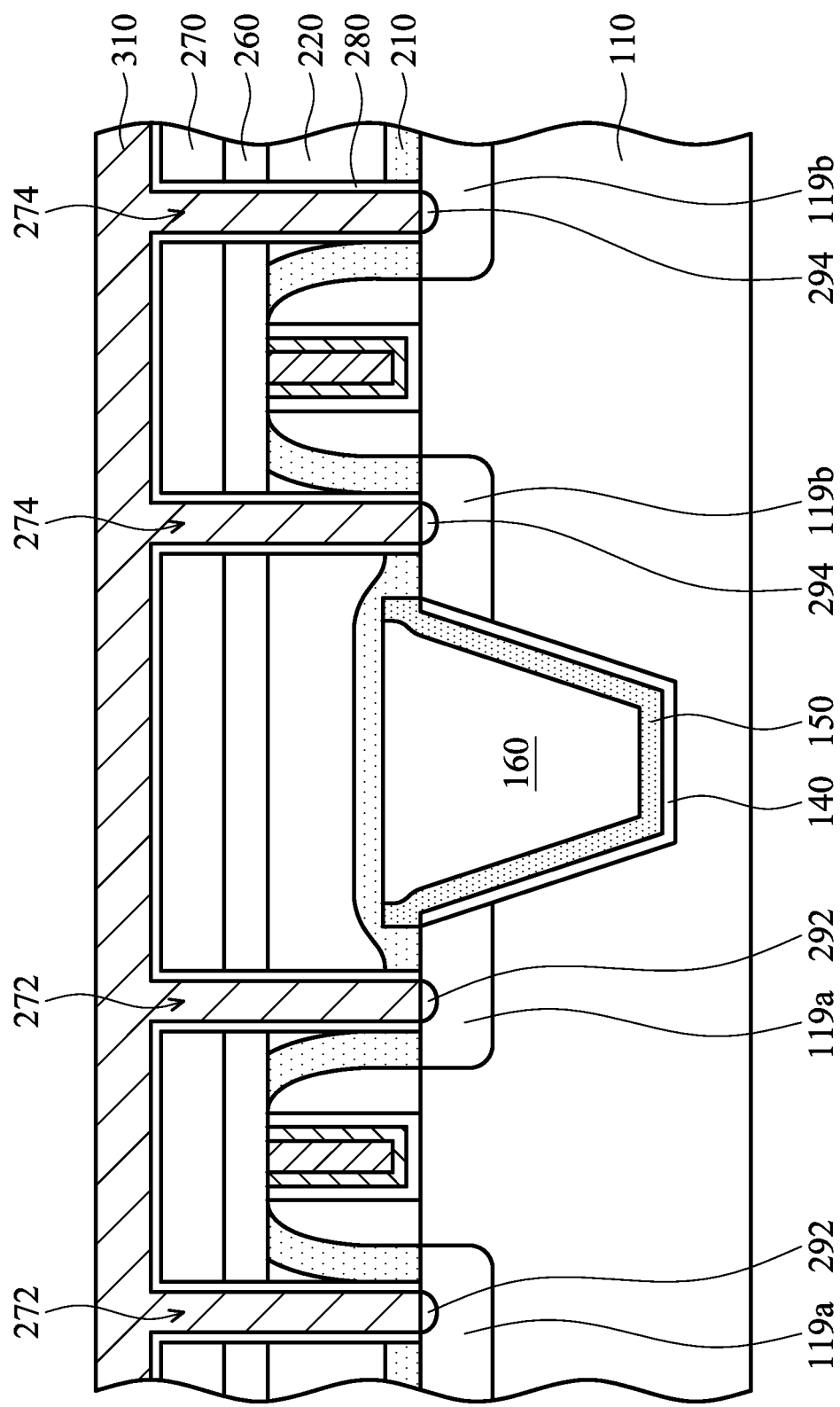

As shown in FIG. 2G, a conductive layer 310 is deposited over the DSL layer 280 and is filled into the openings 272 and 274 to electrically contact the metal silicide structures 292 and 294, in accordance with some embodiments. The conductive layer 310 is formed by a PVD process or other suitable processes. The conductive layer 310 is made of, for example, tungsten or other suitable conductive materials.

Figure 2H:
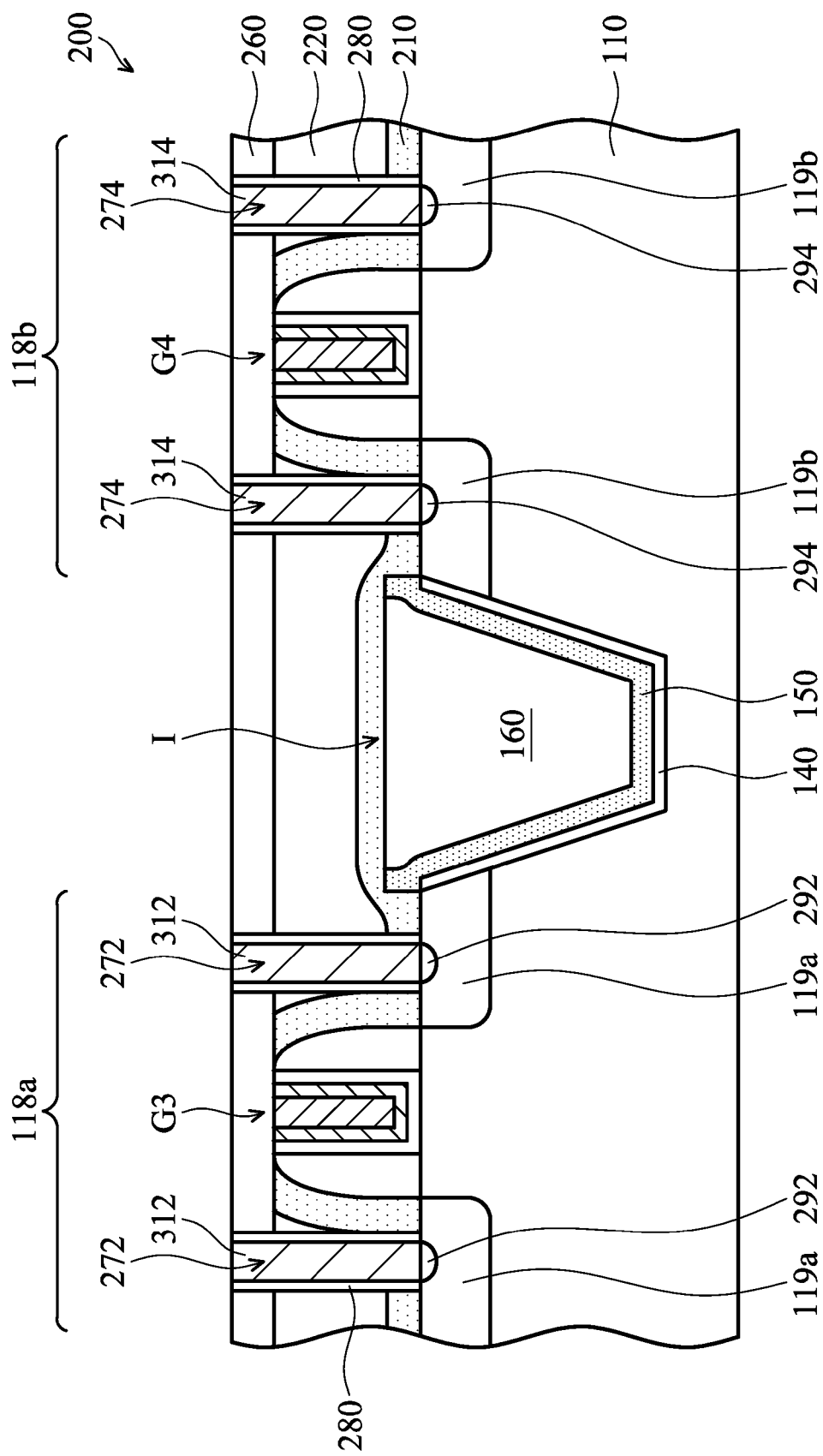

As shown in FIG. 2H, the conductive layer 310 and the DSL layer 280 outside the openings 272 and 274, and the protective layer 270 are removed, in accordance with some embodiments. The removal process includes a chemical mechanical polishing (CMP) process, in accordance with some embodiments.

After the removal process, the conductive layer 310 remaining in the openings 272 forms contact plugs 312 electrically connecting the metal silicide structures 292 and the doped regions 119a (i.e. the S/D regions), in accordance with some embodiments. The conductive layer 310 remaining in the openings 274 forms contact plugs 314 electrically connecting the metal silicide structures 294 and the doped regions 119b (i.e. the S/D regions), in accordance with some embodiments.

In this step, a semiconductor device structure 200 is formed, in accordance with some embodiments. The semiconductor device structure 200 includes metal-oxide-semiconductor field-effect transistors (MOSFETs), such as a p-type MOSFET and a n-type MOSFET. In the semiconductor device structure 200, since the insulating layer 150 prevents the active regions 118a (and 118b) from deformation, the contact plugs 312 (and 314) are formed over the doped regions 119a (and 119b) accurately, in accordance with some embodiments. Therefore, the yield of the semiconductor device structure 200 is improved, in accordance with some embodiments.

In some embodiments, the isolation structure I is formed in a fin field effect transistor. Details of an exemplary process for forming the fin field effect transistor are described as follows.

FIGS. 3A-3F are cross-sectional views of various stages of a process for forming a semiconductor device structure, in accordance with some embodiments.

Figure 3A:
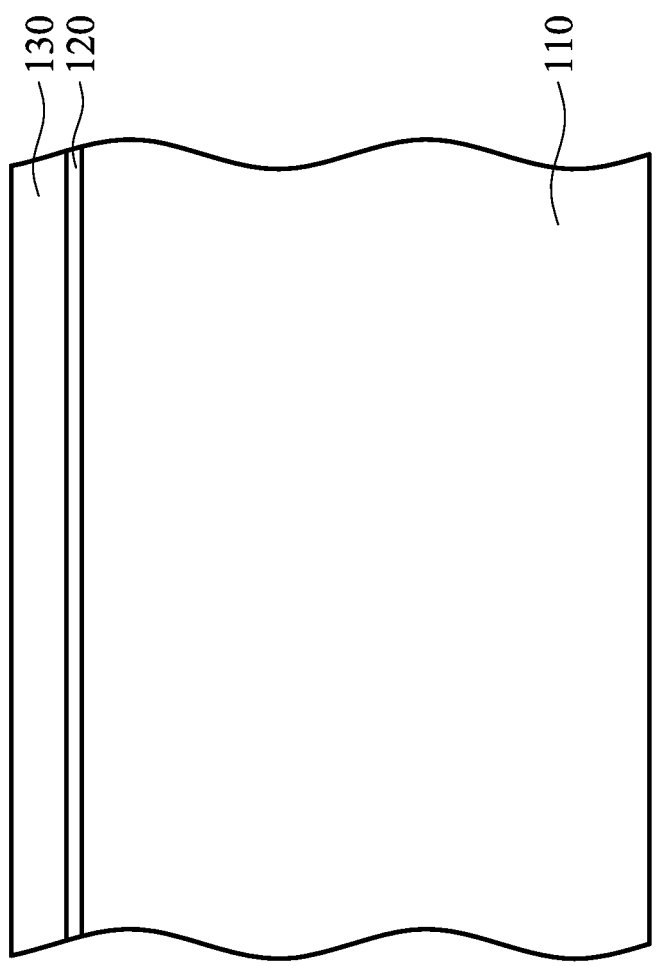
FIGS. 3A-3F are cross-sectional views of various stages of a process for forming a semiconductor device structure, in accordance with some embodiments.

As shown in FIG. 3A, a substrate 110 is provided, in accordance with some embodiments. The substrate 110 includes, for example, a semiconductor substrate. As shown in FIG. 3A, a mask layer 120 is deposited over the substrate 110, in accordance with some embodiments. The mask layer 120 includes oxide (such as silicon oxide), in accordance with some embodiments.

As shown in FIG. 3A, a mask layer 130 is deposited over the mask layer 120, in accordance with some embodiments. The mask layers 120 and 130 are made of different materials, in accordance with some embodiments. The mask layer 130 is thicker than the mask layer 120, in accordance with some embodiments. The mask layer 130 includes nitride (such as silicon nitride), in accordance with some embodiments.

Figure 3B:
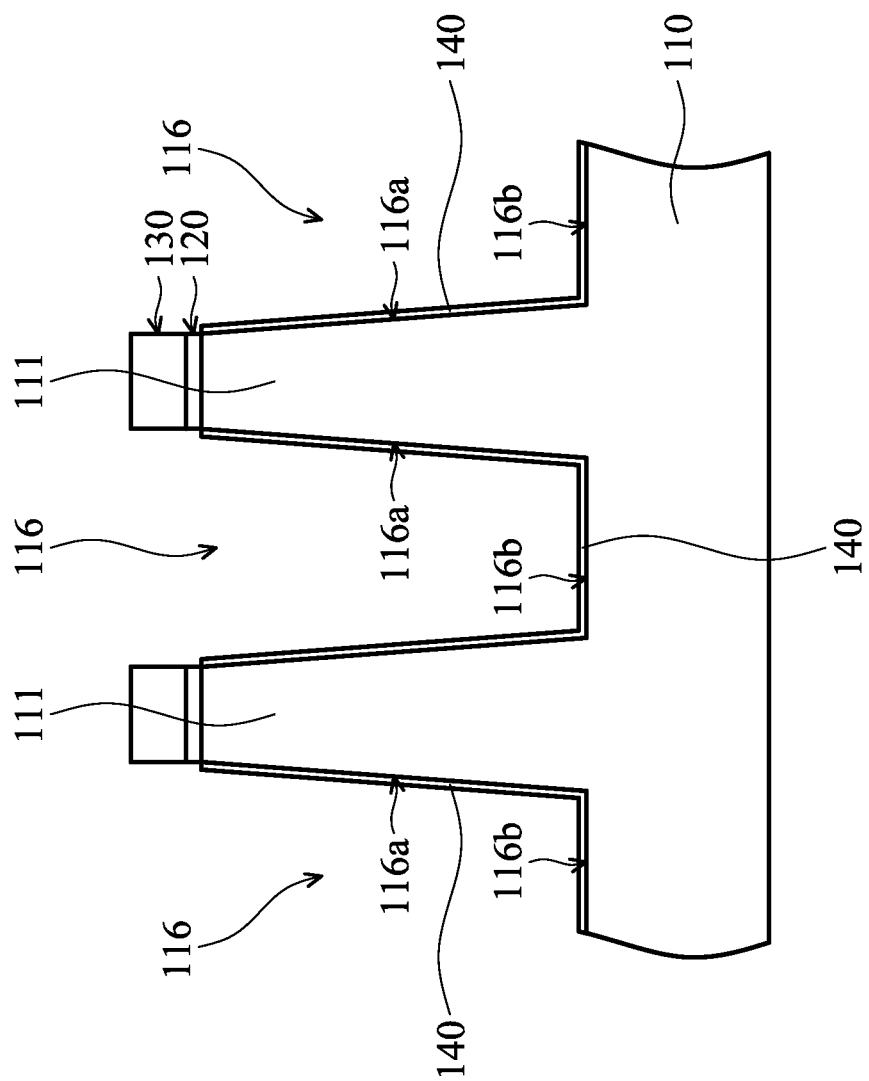

As shown in FIG. 3B, portions of the mask layers 120 and 130 are removed to expose a portion of the substrate 110, in accordance with some embodiments. The portions of the mask layers 120 and 130 are removed using a photolithography process and an etching process, in accordance with some embodiments.

As shown in FIG. 3B, the portions of the substrate 110 exposed by the mask layers 120 and 130 are removed to form trenches 116 in the substrate 110, in accordance with some embodiments. After the removal process, the substrate 110 remaining under the mask layers 120 and 130 forms fin structures 111, in accordance with some embodiments. In some embodiments, the fin structures 111 are referred to as active regions.

Each of the fin structures 111 is located between the trenches 116, in accordance with some embodiments. The trench 116 is between two adjacent fin structures 111 to separate the fin structures 111, in accordance with some embodiments. The removal process includes a dry etching process or another suitable etching process.

As shown in FIG. 3B, liner layers 140 are formed over inner walls 116a and bottom surfaces 116b of the trenches 116, in accordance with some embodiments. The liner layers 140 conformally cover the inner walls 116a and the bottom surfaces 116b, in accordance with some embodiments. The liner layers 140 include oxide (such as silicon oxide), in accordance with some embodiments. The liner layers 140 are formed by a thermal oxidation process, in accordance with some embodiments.

Figure 3C:
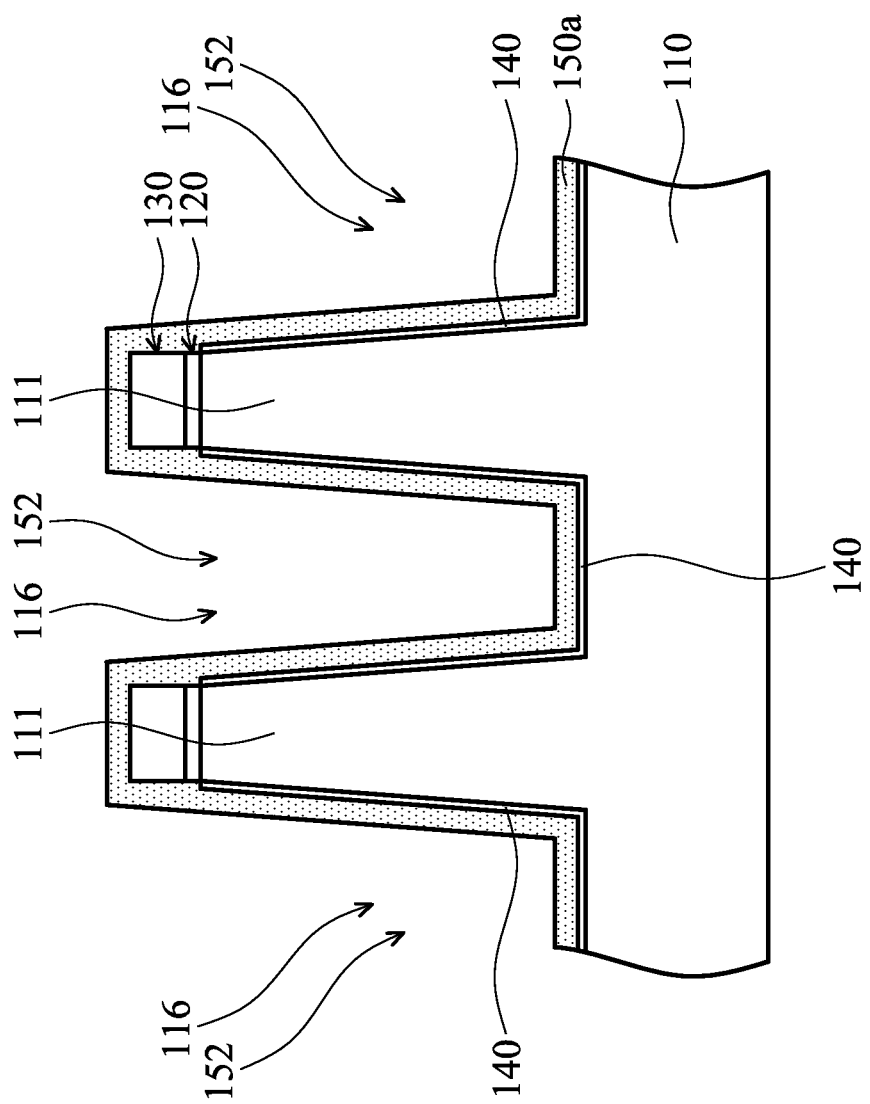

As shown in FIG. 3C, an insulating material layer 150a is formed over the mask layers 120 and 130 and the liner layers 140, in accordance with some embodiments. The insulating material layer 150a conformally covers the mask layers 120 and 130 and the liner layers 140, in accordance with some embodiments.

The insulating material layer 150a has trenches 152 in the trenches 116, in accordance with some embodiments. The insulating material layer 150a includes oxide (such as silicon oxide), in accordance with some embodiments. The insulating material layer 150a is formed using a chemical vapor deposition process (such as an atomic layer deposition process), in accordance with some embodiments.

Figure 3D:
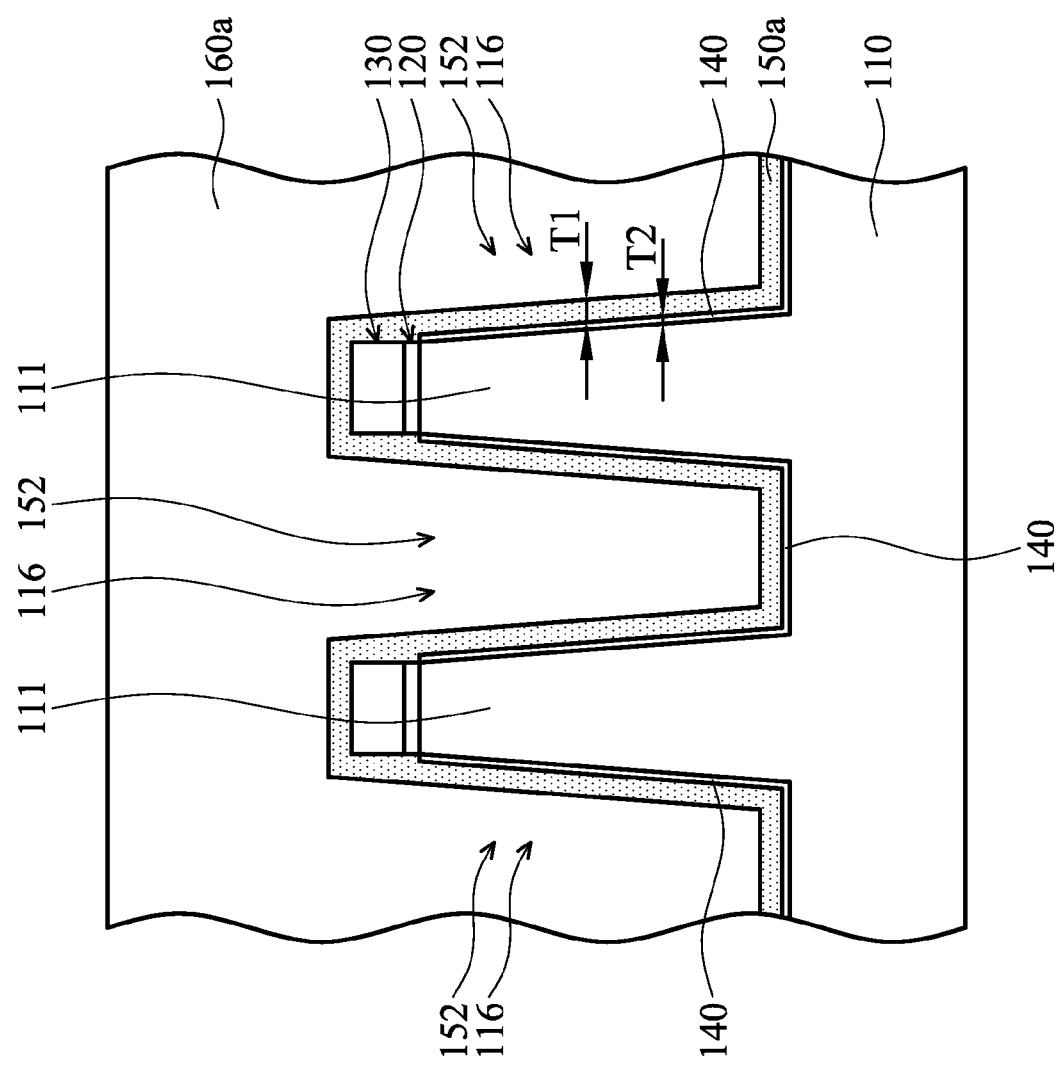

As shown in FIG. 3D, an isolation material layer 160a is formed over the insulating material layer 150a, in accordance with some embodiments. The insulating material layer 150a separates the isolation material layer 160a and the liner layers 140, in accordance with some embodiments.

The isolation material layer 160a fills the trenches 152, in accordance with some embodiments. The isolation material layer 160a includes oxide (such as silicon oxide), in accordance with some embodiments. The isolation material layer 160a is formed by a flowable chemical vapor deposition (FCVD) process, in accordance with some embodiments.

The flowable chemical vapor deposition process uses a silicon-containing material as a precursor, in accordance with some embodiments. The silicon-containing material includes silyl-amines such as $N(SiH_3)_3$ (i.e., TSA), $HN(SiH_3)_2$ (i.e., DSA), $H_2N(SiH_3)$, or other silyl-amines. Therefore, the isolation material layer 160a further includes nitrogen, in accordance with some embodiments.

Thereafter, an annealing process is performed over the isolation material layer 160a, in accordance with some embodiments. The annealing temperature of the annealing process ranges from about 900° C. to about 1300 t, in accordance with some embodiments. The annealing process may result in the deformation of the isolation material layer 160a, which may result in the deformation of the trenches 116 and the fin structures 111.

The isolation material layer 160a and the insulating material layer 150a are formed by different deposition methods, in accordance with some embodiments. In some embodiments, the isolation material layer 160a is formed by a FCVD process, and the insulating material layer 150a is formed by an ALD process. Since the isolation material layer 160a and the insulating material layer 150a are formed by different deposition methods, the insulating material layer 150a may effectively reduce the deformation of the isolation material layer 160a. Therefore, the deformation of the trenches 116 and the fin structures 111 is also significantly reduced or is avoided.

The insulating material layer 150a has a thickness T1, in accordance with some embodiments. The liner layer 140 has a thickness T2, in accordance with some embodiments. The thickness T1 is greater than the thickness T2, in accordance with some embodiments. A ratio (T1/T2) of the thickness T1 to the thickness T2 ranges from about 2 to about 13, in accordance with some embodiments. The thickness T1 ranges from about 100 Å to about 500 Å, in accordance with some embodiments.

If the thickness T1 is too small (such as less than about 100 Å or less than the thickness T2), the insulating material layer 150a may be unable to effectively reduce the deformation of the isolation material layer 160a. If the thickness T1 is too large (such as larger than about 500 Å), it may take too long to form the insulating material layer 150a.

Figure 3E:
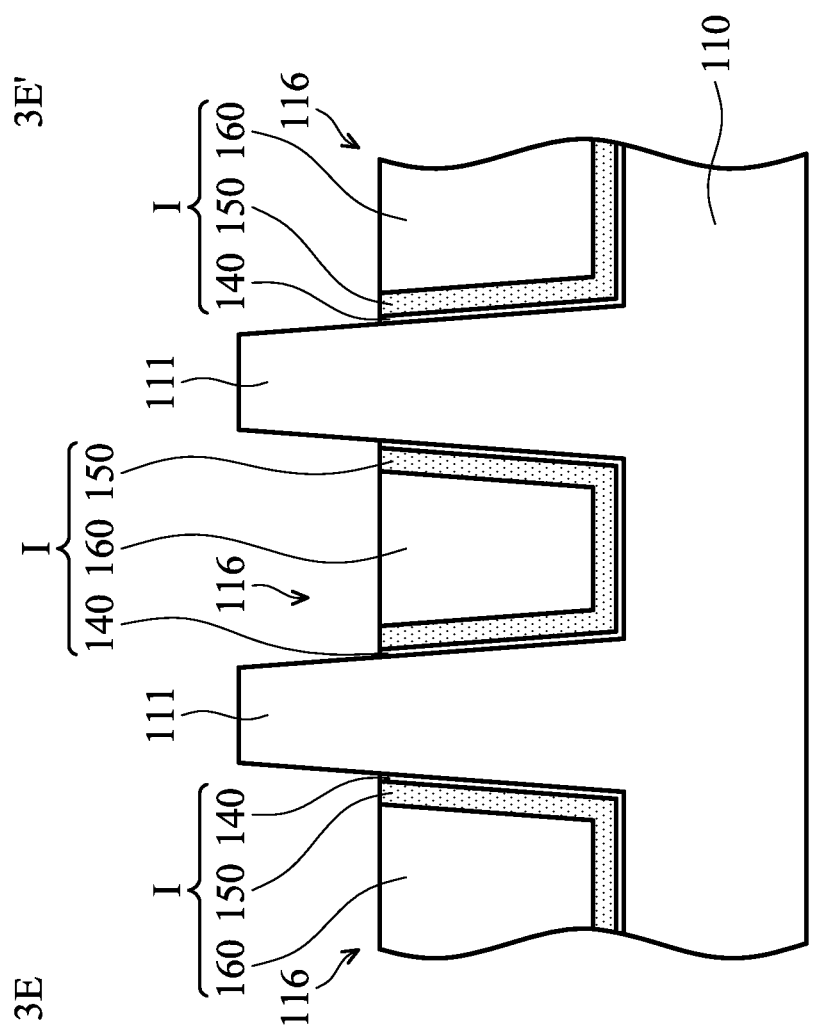
Figure 4A:
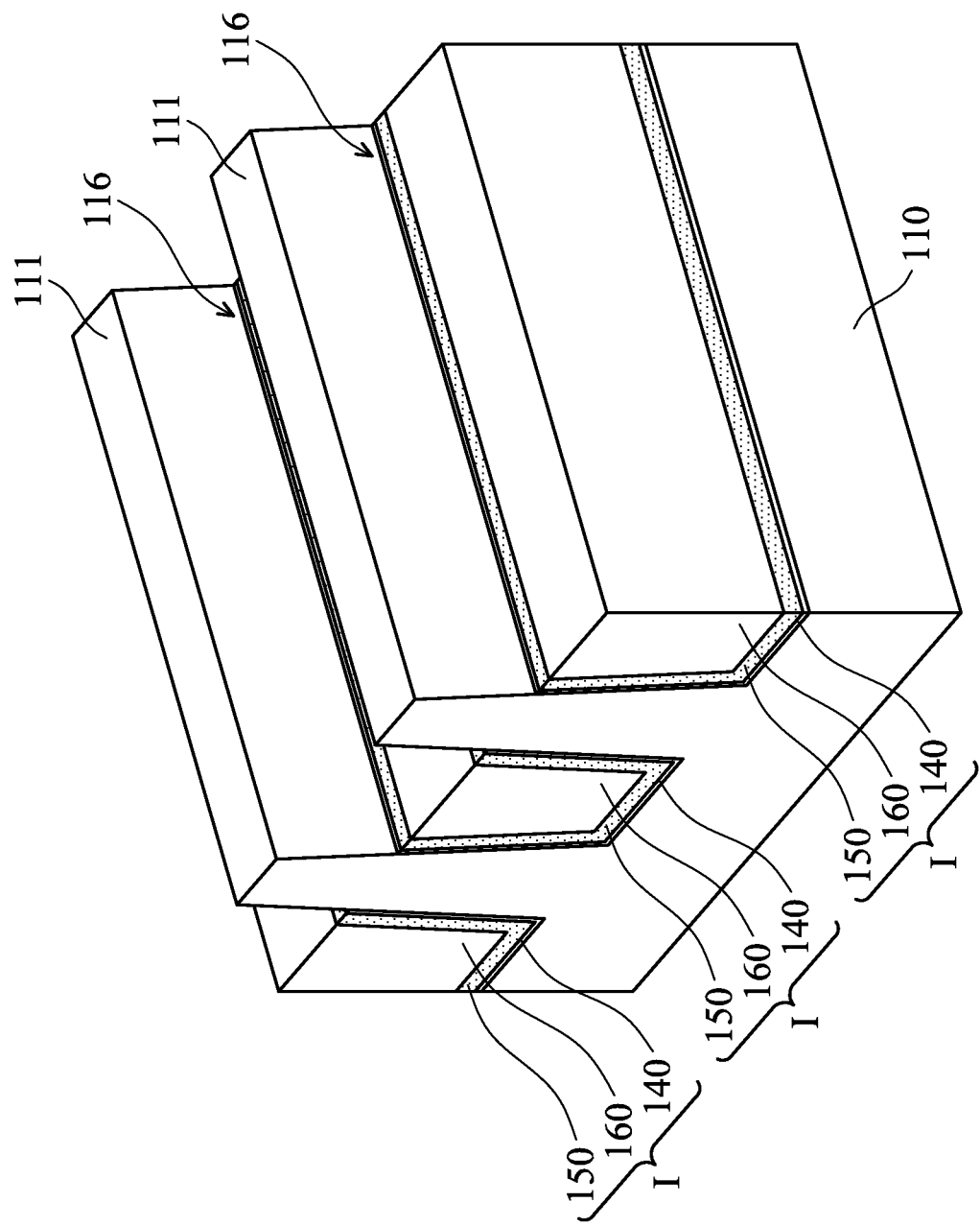
FIG. 4A is a perspective view of a semiconductor device structure of FIG. 3E, in accordance with some embodiments.
Figure 4B:
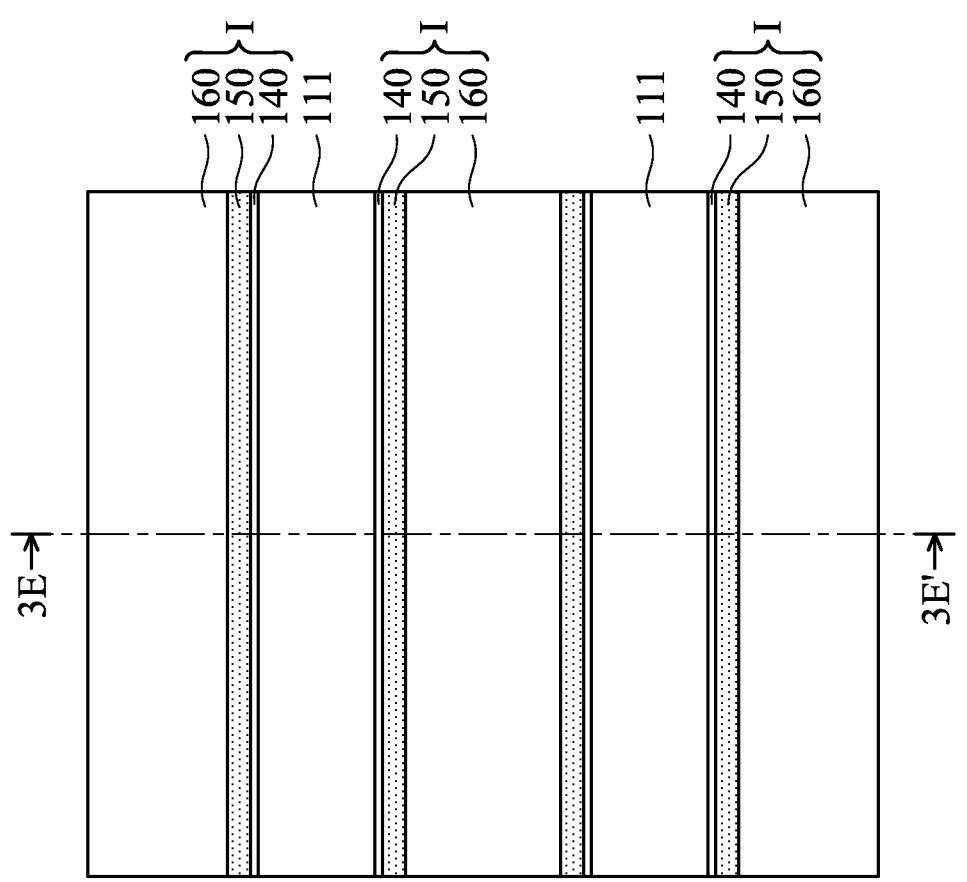
FIG. 4B is a top view of the semiconductor device structure of FIG. 3E, in accordance with some embodiments.

FIG. 4A is a perspective view of a semiconductor device structure of FIG. 3E, in accordance with some embodiments. FIG. 4B is a top view of the semiconductor device structure of FIG. 3E, in accordance with some embodiments. FIG. 3E is a cross-sectional view of the semiconductor device structure along a sectional line 3E-3E' in FIG. 4B, in accordance with some embodiments.

As shown in FIGS. 3E, 4A, and 4B, the isolation material layer 160a outside of the trenches 116, portions of the isolation material layer 160a in the trenches 116, and the mask layers 120 and 130 are removed, in accordance with some embodiments. After the removal process, the isolation material layer 160a remaining in the trenches 116 forms isolation layers 160.

The insulating material layer 150a remaining in the trenches 116 forms insulating layers 150, in accordance with some embodiments. In each of the trenches 116, the liner layer 140, the insulating layer 150, and the isolation layer 160 form an isolation structure I, in accordance with some embodiments. The isolation structure I fills a portion of the corresponding trench 116, in accordance with some embodiments. The removal process includes a CMP process and an etching process, in accordance with some embodiments.

Figure 3F:
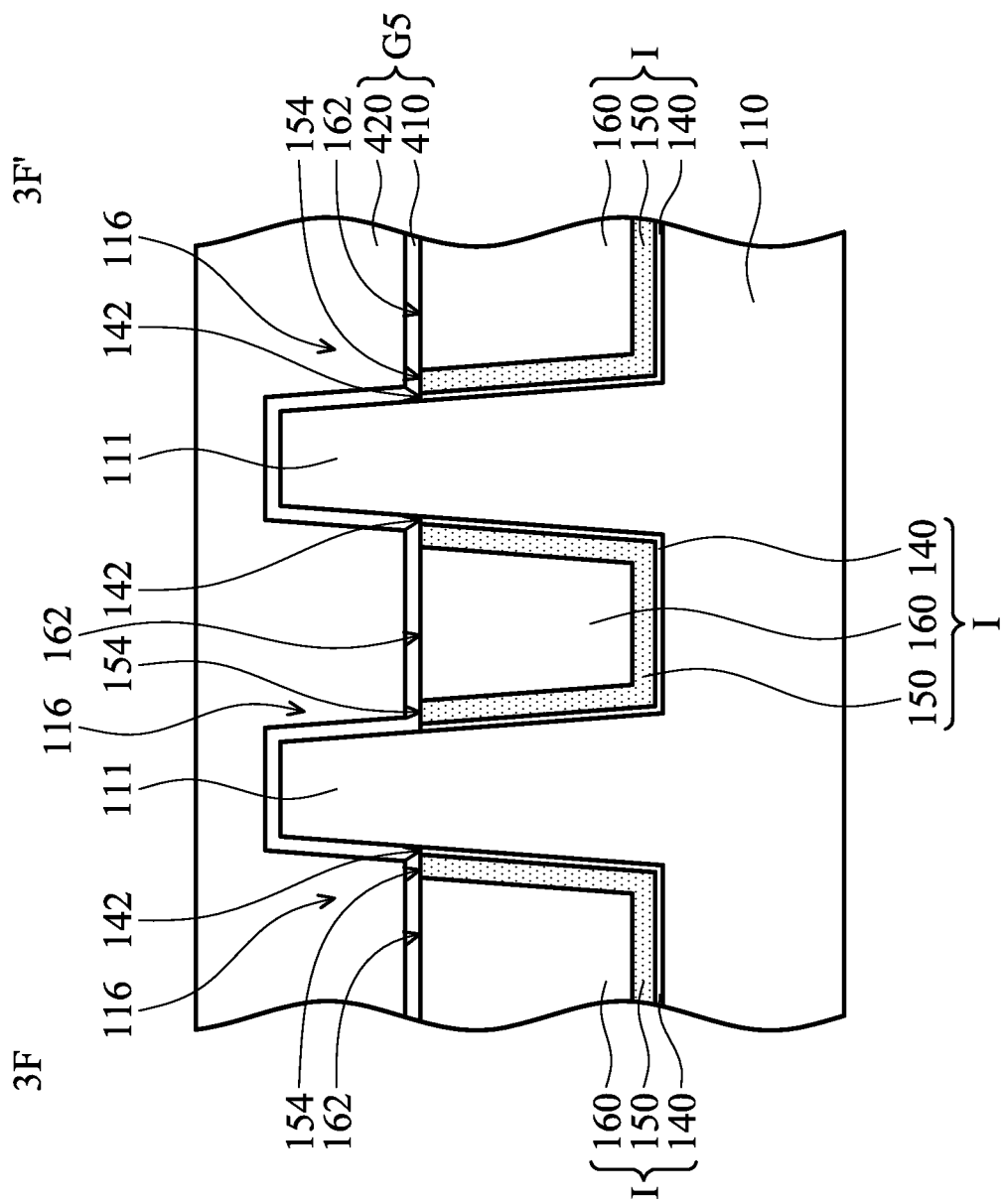
Figure 5A:
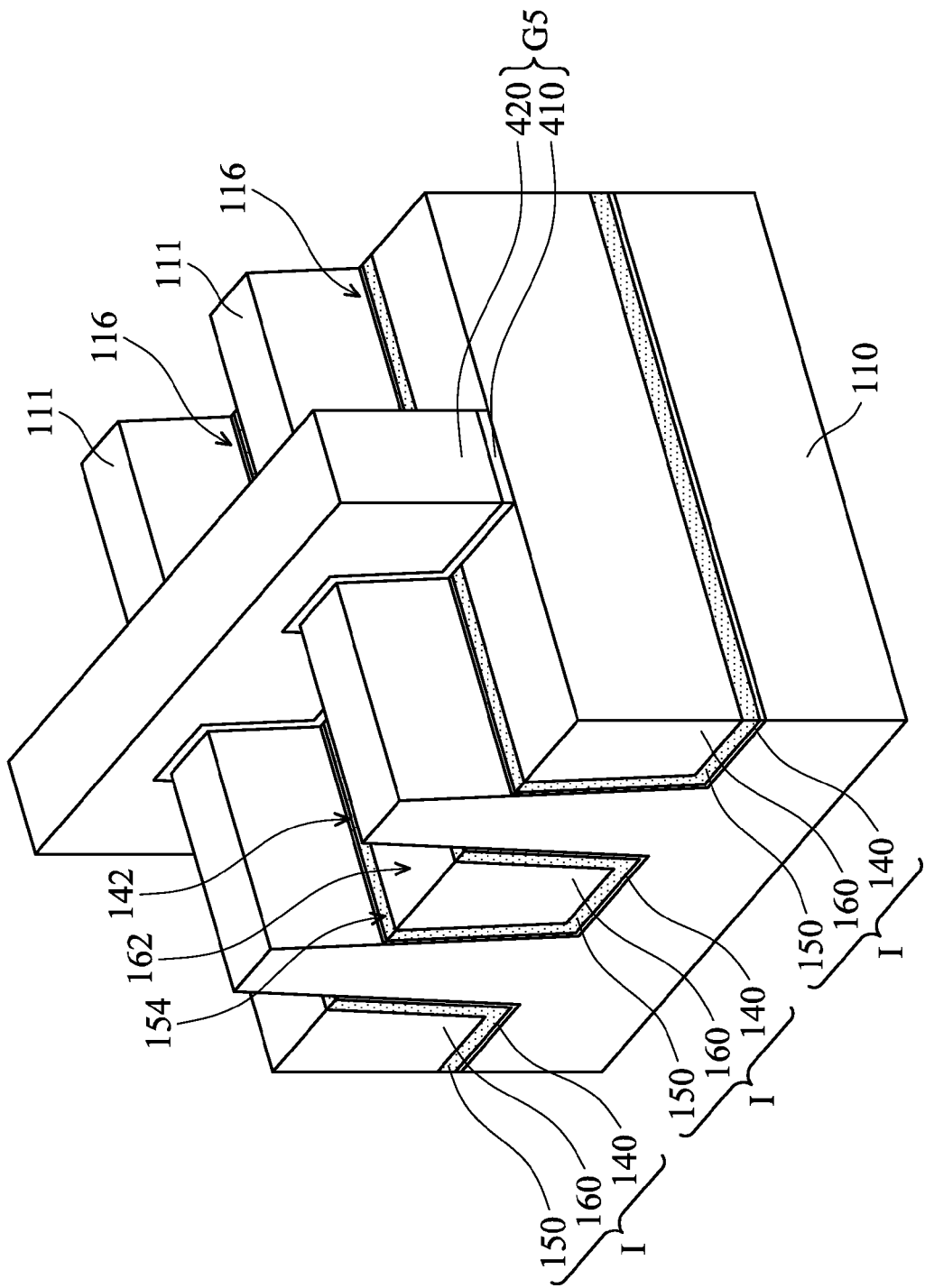
FIG. 5A is a perspective view of a semiconductor device structure of FIG. 3F, in accordance with some embodiments.
Figure 5B:
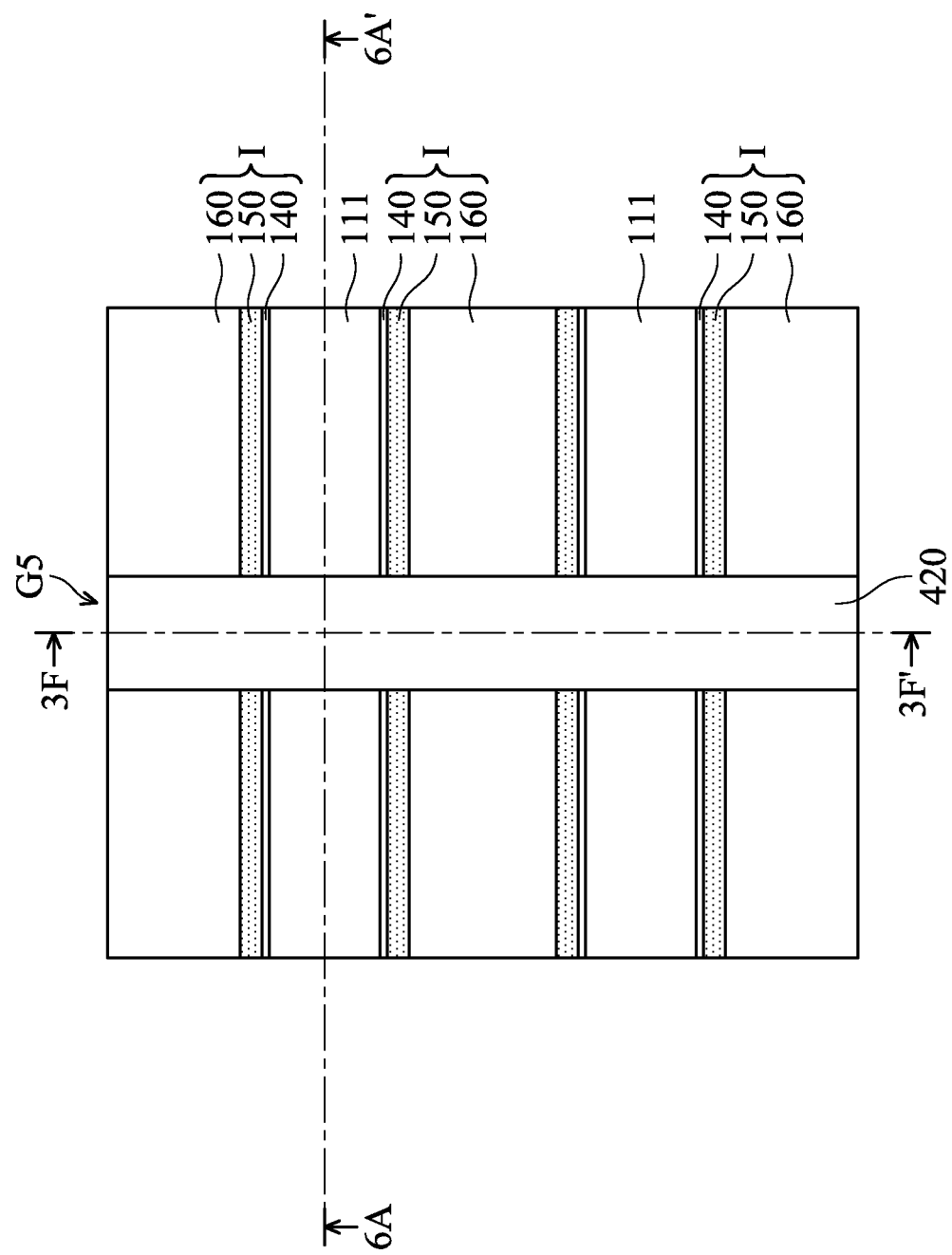
FIG. 5B is a top view of the semiconductor device structure of FIG. 3F, in accordance with some embodiments.

FIG. 5A is a perspective view of a semiconductor device structure of FIG. 3F, in accordance with some embodiments. FIG. 5B is a top view of the semiconductor device structure of FIG. 3F, in accordance with some embodiments. FIG. 3F is a cross-sectional view of the semiconductor device structure along a sectional line 3F-3F' in FIG. 5B, in accordance with some embodiments. FIG. 6A is a cross-sectional view of the semiconductor device structure along a sectional line 6A-6A' in FIG. 5B, in accordance with some embodiments.

As shown in FIGS. 3F, 5A, 5B, and 6A, a gate dielectric layer 410 and a gate 420 are formed over the fin structures 111 and the isolation structures I, in accordance with some embodiments. The gate dielectric layer 410 is in direct contact with the liner layer 140, the insulating layer 150, and the isolation layer 160, in accordance with some embodiments.

The gate dielectric layer 410 conformally covers upper surfaces 142, 154, and 162 of the liner layer 140, the insulating layer 150, and the isolation layer 160, in accordance with some embodiments. In some embodiments, the upper surfaces 142, 154, and 162 are substantially aligned with each other.

The gate 420 is formed over the gate dielectric layer 410, in accordance with some embodiments. The gate 420 and the gate dielectric layer 410 form a gate stack G5, in accordance with some embodiments. A portion of the gate stack G5 is in the trenches 116, in accordance with some embodiments.

FIGS. 6A-6G are cross-sectional views of various stages of a process for forming a semiconductor device structure 600, in accordance with some embodiments. FIG. 7 is a perspective view of the semiconductor device structure 600 of FIG. 6G, in accordance with some embodiments.

Figure 6B:
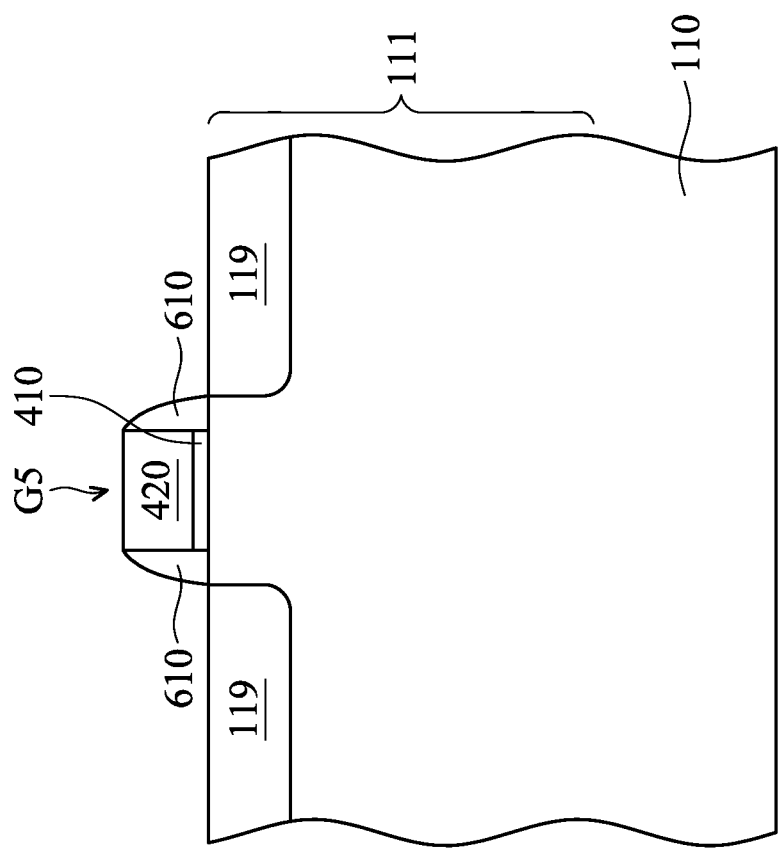
Figure 7:
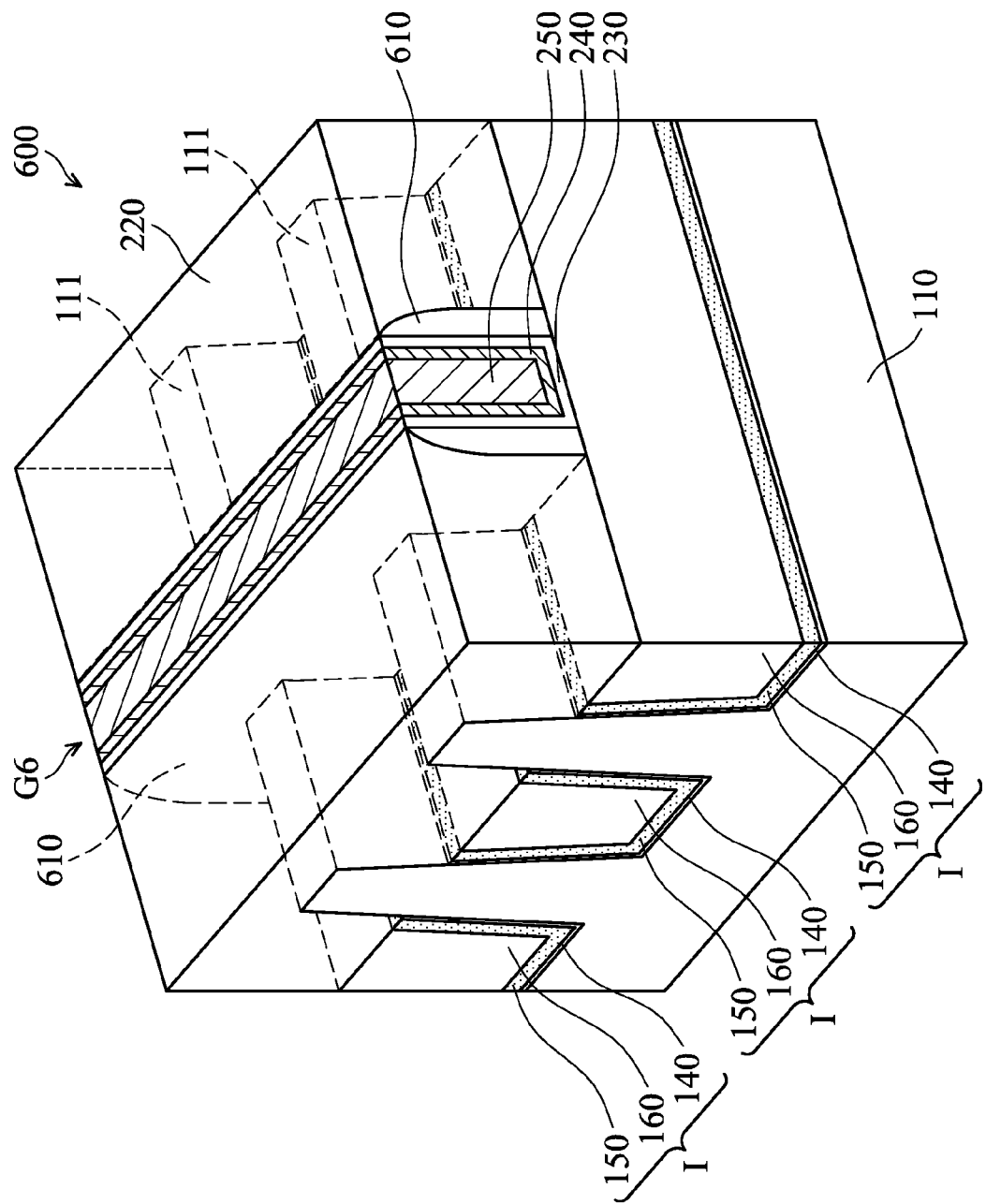
FIG. 7 is a perspective view of the semiconductor device structure of FIG. 6G, in accordance with some embodiments.

After the step of FIG. 6A, as shown in FIG. 6B, spacers 610 are formed over sidewalls of the gate stack G5, in accordance with some embodiments. The spacers 610 include insulating materials, such as silicon oxide or silicon nitride, in accordance with some embodiments. The formation of the spacers 610 includes a deposition process and an anisotropic etching process, in accordance with some embodiments.

As shown in FIG. 6B, doped regions 119 are formed in the fin structures 111, in accordance with some embodiments. The formation of the doped regions 119 includes as an ion implantation process, in accordance with some embodiments. The ion implantation process is performed to introduce p-type impurities (e.g., boron) or n-type impurities (e.g., phosphorus) into the fin structures 111, in accordance with some embodiments. The doped regions 119 are a doped source region and a doped drain region, in accordance with some embodiments. The doped regions 119 are located at the two opposite sides of the gate stack G5, in accordance with some embodiments.

Figure 6C:
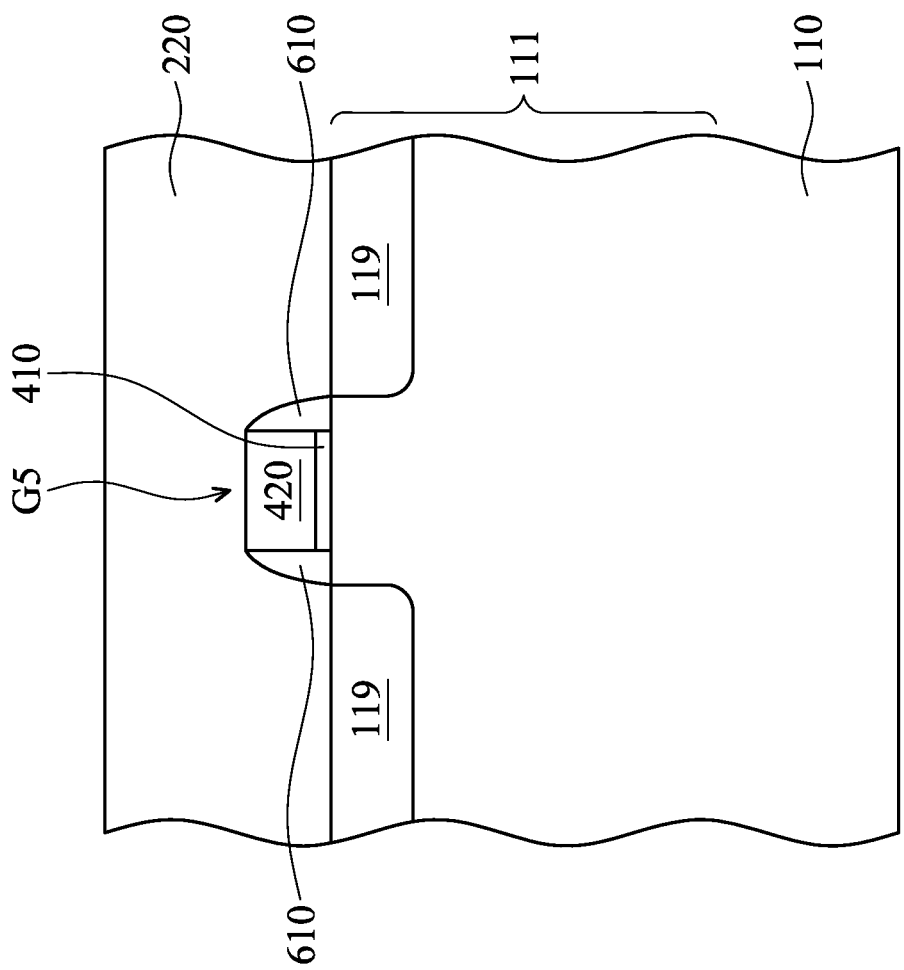
Figure 6D:
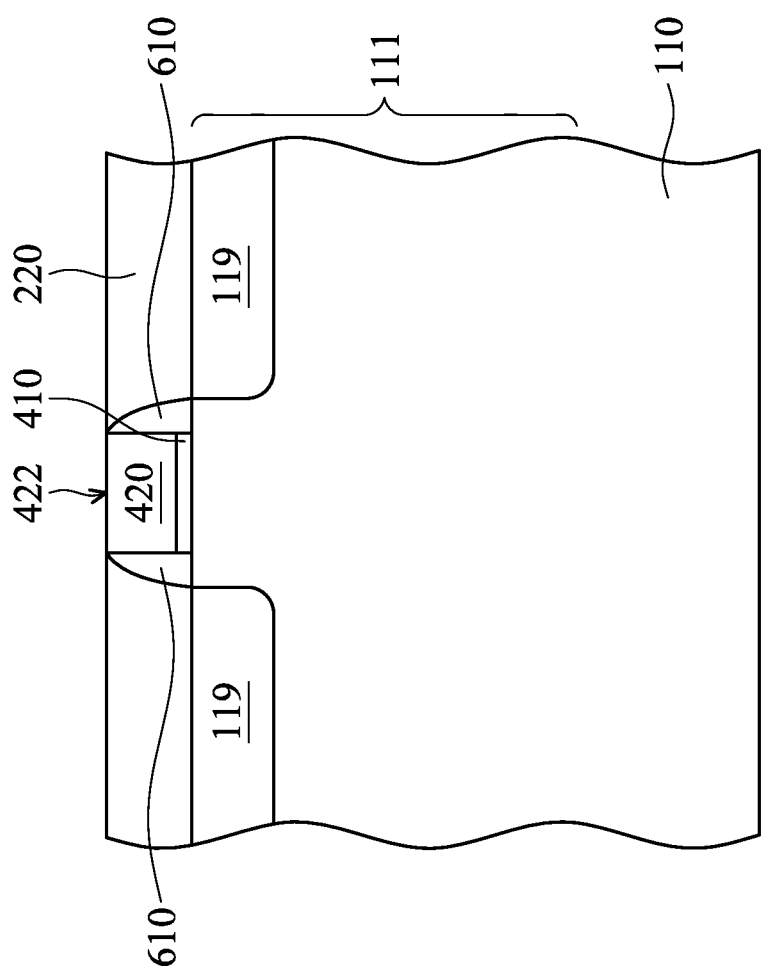

As shown in FIG. 6C, an insulating layer 220 is formed over the semiconductor substrate 110, the gate stack G5, and the spacers 610, in accordance with some embodiments. As shown in FIG. 6D, a planarization process is then performed on the insulating layer 220 until a top surface 422 of the gate 420 is exposed, in accordance with some embodiments. The planarization process includes a chemical mechanical polishing (CMP) process, in accordance with some embodiments.

Figure 6E:
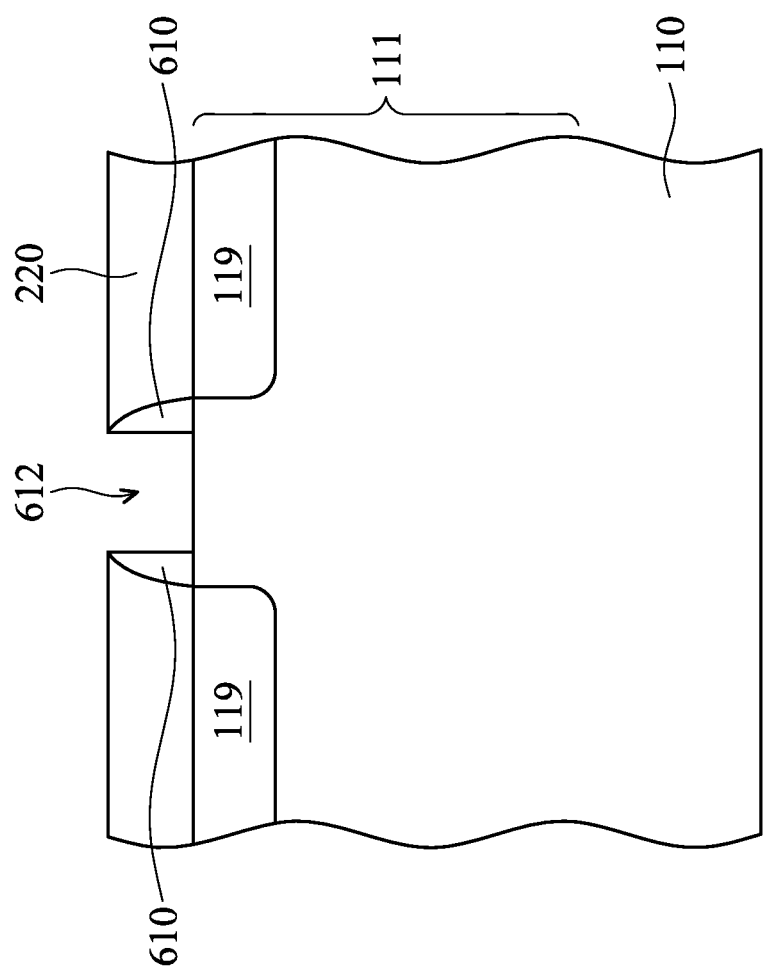

As shown in FIG. 6E, the gate 420 and the gate dielectric layer 410 are removed, in accordance with some embodiments. The removal process includes a wet etching process, in accordance with some embodiments. After the removal process, an opening 612 is formed between the spacers 610, in accordance with some embodiments.

Figure 6F:
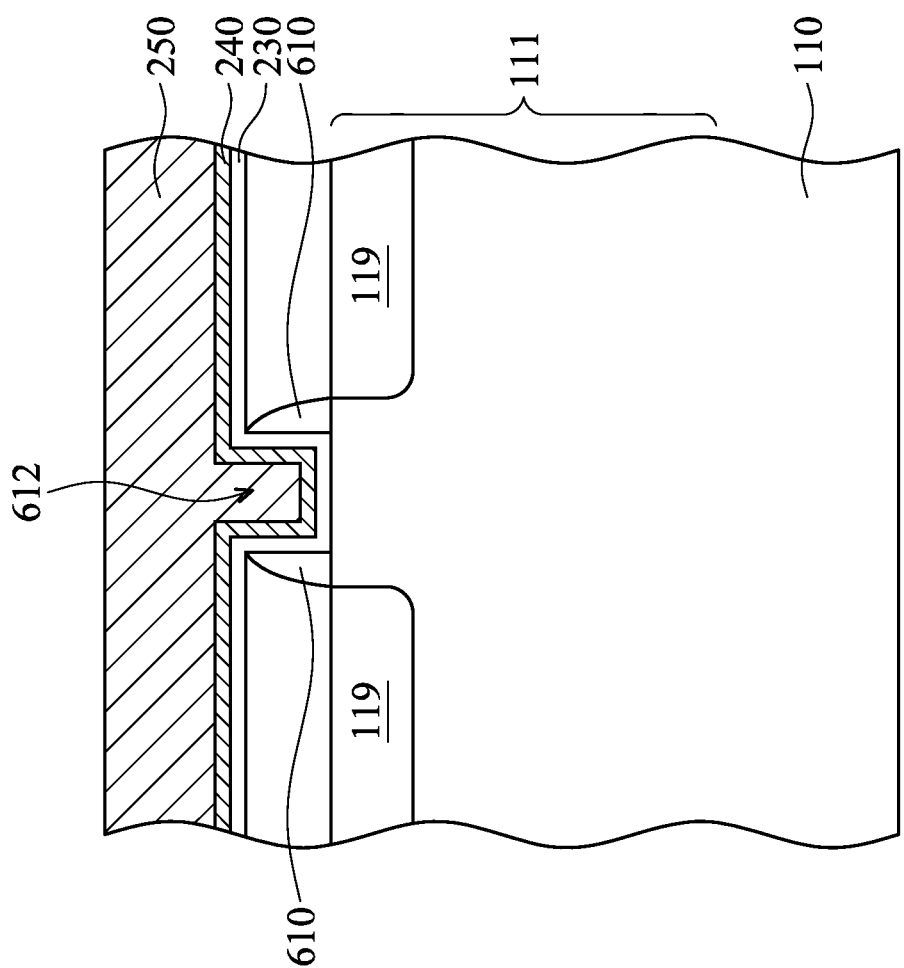

As shown in FIG. 6F, a gate dielectric layer 230 is formed to cover a bottom surface of the opening 612, in accordance with some embodiments. Thereafter, a work function metal layer 240 is deposited over the gate dielectric layer 230, in accordance with some embodiments.

Afterwards, a gate electrode layer 250 (also called a metal gate electrode layer) is deposited over the work function metal layer 240 to fill the opening 612, in accordance with some embodiments. The gate electrode layer 250 is made of a suitable metal material, such as aluminum, tungsten, gold, platinum, cobalt, other suitable metal, an alloy thereof, or a combination thereof, in accordance with some embodiments.

Figure 6G:
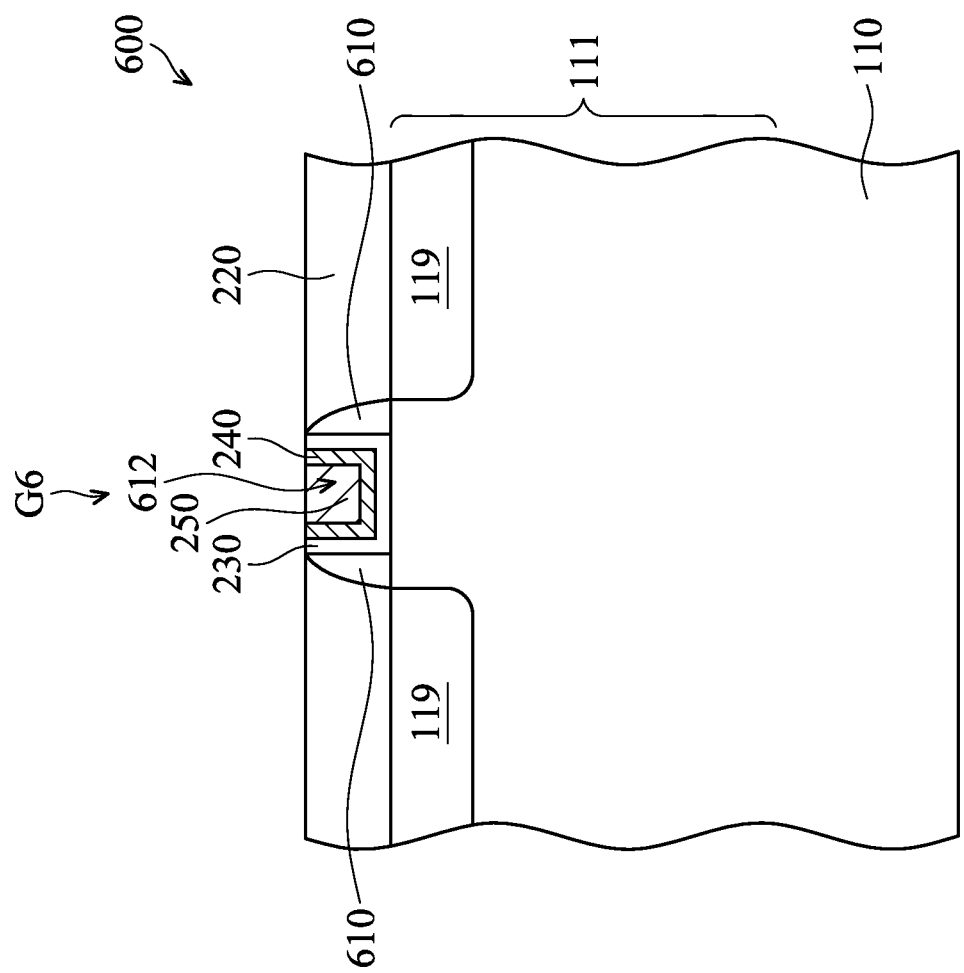

As shown in FIGS. 6G and 7, a planarization process is performed to remove the gate electrode layer 250, the work function metal layer 240, and the gate dielectric layer 230 outside of the opening 612, in accordance with some embodiments.

In this step, a semiconductor device structure 600 is formed. In the semiconductor device structure 600, the gate electrode layer 250, the work function metal layer 240, and the gate dielectric layer 230 remaining in the opening 612 form a gate stack G6, in accordance with some embodiments. The gate stack G6 is also referred to as a metal gate stack, in accordance with some embodiments. Since the insulating layer 150 prevents the fin structures 111 from deformation, the yield of the semiconductor device structure 600 is improved, in accordance with some embodiments.

In accordance with some embodiments, semiconductor device structures and methods for forming the same are provided. In a trench of a substrate, the methods (for forming the semiconductor device structure) form an insulating layer between the substrate and an isolation layer to reduce the deformation of the isolation layer during an annealing process. Therefore, the deformation of the trench and active regions (or fin structures) adjacent to the trench is significantly reduced or is avoided, which improves the yield of the semiconductor device structure.

In accordance with some embodiments, a semiconductor device structure is provided. The semiconductor device structure includes a substrate having a first trench between a first active region and a second active region of the substrate. The semiconductor device structure includes an isolation structure in the first trench. The isolation structure includes a liner layer, an insulating layer, and an isolation layer. The liner layer covers an inner wall and a bottom surface of the first trench. The insulating layer covers the liner layer and has a second trench in the first trench. The isolation layer is over the insulating layer and fills the second trench. A first thickness of the insulating layer is greater than a second thickness of the liner layer.

In accordance with some embodiments, a semiconductor device structure is provided. The semiconductor device structure includes a substrate having a first fin structure and a second fin structure. The substrate has a first trench between the first fin structure and the second fin structure. The semiconductor device structure includes an isolation structure filling a first portion of the first trench. The isolation structure includes a liner layer, an insulating layer, and an isolation layer. The liner layer covers an inner wall and a bottom surface of the first trench. The insulating layer covers the liner layer and has a second trench in the first trench. The isolation layer is over the insulating layer and fills the second trench. A first thickness of the insulating layer is greater than a second thickness of the liner layer. The semiconductor device structure includes a gate stack over the first fin structure and the isolation structure.

In accordance with some embodiments, a method for forming a semiconductor device structure is provided. The method includes forming a first trench in a substrate and between a first active region and a second active region of the substrate. The method includes forming a liner layer over an inner wall and a bottom surface of the first trench. The method includes forming an insulating layer over the liner layer. A first thickness of the insulating layer is greater than a second thickness of the liner layer. The insulating layer has a second trench in the first trench. The method includes forming an isolation layer in the second trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a substrate having a first trench between a first active region and a second active region of the substrate; and
an isolation structure in the first trench, wherein the isolation structure comprises a liner layer, an insulating layer, and an isolation layer, the liner layer covers an inner wall and a bottom surface of the first trench, the insulating layer covers the liner layer and has a second trench in the first trench, the isolation layer is over the insulating layer and fills the second trench, a first thickness of the insulating layer is greater than a second thickness of the liner layer, a first portion of the insulating layer and a second portion of the isolation layer are outside of the first trench, and a first top surface of the first portion is aligned with a second top surface of the second portion.

2. The semiconductor device structure as claimed in claim 1, wherein the insulating layer separates the isolation layer from the liner layer.

3. The semiconductor device structure as claimed in claim 1, wherein the insulating layer conformally covers the liner layer.

4. The semiconductor device structure as claimed in claim 1, wherein the first portion of the insulating layer covers an upper surface of the liner layer.

5. The semiconductor device structure as claimed in claim 4, wherein the first portion of the insulating layer covers a sidewall of the isolation layer outside of the first trench.

6. The semiconductor device structure as claimed in claim 1, wherein the isolation layer comprises silicon oxide and nitrogen.

7. The semiconductor device structure as claimed in claim 1, wherein the isolation structure fills the first trench.

8. The semiconductor device structure as claimed in claim 1, wherein the substrate has a first doped region and a second doped region in the first active region, the first doped region is adjacent to the liner layer, and the semiconductor device structure further comprises:
a gate stack over the first active region and between the first doped region and the second doped region.

9. The semiconductor device structure as claimed in claim 1, wherein the liner layer, the insulating layer, and the isolation layer comprise a same material.

10. A semiconductor device structure, comprising:
a substrate having a first fin structure and a second fin structure, wherein the substrate has a first trench between the first fin structure and the second fin structure;
an isolation structure filling a first portion of the first trench, wherein the isolation structure comprises a liner layer, an insulating layer, and an isolation layer, the liner layer covers an inner wall and a bottom surface of the first trench, the insulating layer covers the liner layer and has a second trench in the first trench, the isolation layer is over the insulating layer and fills the second trench, and a first thickness of the insulating layer is greater than a second thickness of the liner layer; and a gate stack over the first fin structure and the isolation structure.

11. The semiconductor device structure as claimed in claim 10, wherein a second portion of the gate stack is in the first trench.

12. The semiconductor device structure as claimed in claim 10, wherein the insulating layer conformally covers the liner layer.

13. The semiconductor device structure as claimed in claim 10, wherein the insulating layer separates the isolation layer from the liner layer.

14. The semiconductor device structure as claimed in claim 10, wherein the isolation layer comprises silicon oxide and nitrogen.

15. The semiconductor device structure as claimed in claim 10, wherein a first upper surface of the insulating layer, a second upper surface of the liner layer, and a third upper surface of the isolation layer are substantially aligned with each other.

16. A semiconductor device structure, comprising:

a substrate having a first fin structure and a second fin structure, wherein the substrate has a first trench between the first fin structure and the second fin structure;

an isolation structure filling a first portion of the first trench, wherein the isolation structure comprises a liner layer, an insulating layer, and an isolation layer, the liner layer covers an inner wall and a bottom surface of the first trench, the insulating layer covers the liner layer and has a second trench in the first trench, the isolation layer is over the insulating layer and fills the second trench, a first thickness of the insulating layer is greater than a second thickness of the liner layer, and the isolation layer comprises nitrogen; and a gate stack over the first fin structure and the isolation structure.

17. The semiconductor device structure as claimed in claim 16, wherein a second portion of the gate stack is in the first trench.

18. The semiconductor device structure as claimed in claim 16, wherein the insulating layer conformally covers the liner layer.

19. The semiconductor device structure as claimed in claim 16, wherein the insulating layer separates the isolation layer from the liner layer.

20. The semiconductor device structure as claimed in claim 16, wherein a first upper surface of the insulating layer, a second upper surface of the liner layer, and a third upper surface of the isolation layer are substantially aligned with each other.

* * * * *